(12) United States Patent
Ding et al.

(10) Patent No.: US 10,629,662 B2
(45) Date of Patent: Apr. 21, 2020

(54) DISPLAY PANEL, FABRICATING METHOD AND DISPLAY DEVICE

(71) Applicant: SHANGHAI TIANMA MICRO-ELECTRONICS CO., LTD., Shanghai (CN)

(72) Inventors: Hong Ding, Shanghai (CN); Lingxiao Du, Shanghai (CN); Liang Xie, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/169,084

(22) Filed: Oct. 24, 2018

(65) Prior Publication Data

US 2019/0333972 A1    Oct. 31, 2019

(30) Foreign Application Priority Data

Apr. 26, 2018 (CN) .......................... 2018 1 0383582

(51) Int. Cl.
*H01L 27/32* (2006.01)
*H01L 27/12* (2006.01)
*H01L 51/52* (2006.01)
*H01L 51/56* (2006.01)

(52) U.S. Cl.
CPC ........ *H01L 27/3246* (2013.01); *H01L 27/127* (2013.01); *H01L 51/5256* (2013.01); *H01L 51/56* (2013.01); *H01L 2227/323* (2013.01)

(58) Field of Classification Search
CPC ............... H01L 27/3246; H01L 27/127; H01L 51/5256; H01L 2227/323
See application file for complete search history.

(56) References Cited

U.S. PATENT DOCUMENTS

2017/0237038 A1* 8/2017 Kim .................... H01L 51/5253
257/40

FOREIGN PATENT DOCUMENTS

| CN | 106450008 A | 2/2017 |
| CN | 107085475 A | 8/2017 |

* cited by examiner

*Primary Examiner* — Hsien Ming Lee
(74) *Attorney, Agent, or Firm* — Anova Law Group PLLC

(57) ABSTRACT

A display panel, fabrication method, and a display device are provided. The display panel includes a display region; a substrate panel; a display function layer, in the display region and over the substrate panel; a hollow portion, penetrating through the display panel; and at least one spacer part. The spacer part includes a bottom pattern and a spacer pattern. The bottom pattern is an orthographic projection, on the substrate panel, of a bottom surface of the spacer part close to the substrate panel, and has a side edge close to the hollow portion as a first inner side edge. The spacer pattern is an orthographic projection of the spacer part on the substrate panel, and has a side edge close to the hollow portion as a second inner side edge. The second inner side edge is closer to the hollow portion than the first inner side edge.

20 Claims, 25 Drawing Sheets

Form a first inorganic layer covering the display function layer and extending to the side surface of the spacer part away from the substrate panel

↓

Form an organic layer covering the display function layer

↓

Form a second inorganic layer covering the display function layer and extending to the side surface of the spacer part away from the substrate panel

DISPLAY PANEL, FABRICATING METHOD AND DISPLAY DEVICE

CROSS-REFERENCES TO RELATED APPLICATION

This application claims the priority of Chinese Patent Application No. 201810383582.4, filed on Apr. 26, 2018, the content of which is incorporated herein by reference in its entirety.

TECHNICAL FIELD

The present disclosure generally relates to the field of display technology and, more particularly, relates to a display panel, fabricating method, and a display device.

BACKGROUND

Among human sensory organs, visual organs (eyes) receive most information. As more abundant visual information is desired, display technologies play a very important role in today's society. The display technologies have been rapidly developed from cathode ray tube technology (CRT), plasma display (PDP), liquid crystal display (LCD), to the latest organic light emitting display (OLED) and microlight emitting display (micro LED) display.

Currently, the development of display technologies moves rapidly in a direction towards having narrow borders, high contrast, high resolution, full-color display, lower power consumption, high reliability, long life, and mall thickness/small weight. Display panels, which is easy to cut for forming irregularly-shaped display panels, become favored consumers. One of key problems includes how to improve the reliability of the irregularly-shaped display panels.

The disclosed display panel, fabrication method, and display device are directed to solve one or more problems set forth above and other problems.

SUMMARY

One aspect of the present disclosure provides a display panel. The display panel includes: a display region; a substrate panel; a display function layer, in the display region and over the substrate panel; a hollow portion, penetrating through the display panel along a direction perpendicular to a surface of the substrate panel; and at least one spacer part, configured between the display region and the hollow portion. The spacer part includes a bottom pattern and a spacer pattern. The bottom pattern is an orthographic projection, on the substrate panel, of a bottom surface of the spacer part close to the substrate panel. The bottom pattern has a side edge close to the hollow portion as a first inner side edge and a side edge away from the hollow portion as a first outer side edge. The spacer pattern is an orthographic projection of the spacer part on the substrate panel. The spacer pattern has a side edge close to the hollow portion as a second inner side edge and a side edge away from the hollow portion as a second outer side edge. The second inner side edge is closer to the hollow portion than the first inner side edge.

Another aspect of the present disclosure provides a display device including a display panel. The display panel includes: a display region; a substrate panel; a display function layer, in the display region and over the substrate panel; a hollow portion, penetrating through the display panel along a direction perpendicular to a surface of the substrate panel; and at least one spacer part, configured between the display region and the hollow portion. The spacer part includes a bottom pattern and a spacer pattern. The bottom pattern is an orthographic projection, on the substrate panel, of a bottom surface of the spacer part close to the substrate panel. The bottom pattern has a side edge close to the hollow portion as a first inner side edge and a side edge away from the hollow portion as a first outer side edge. The spacer pattern is an orthographic projection of the spacer part on the substrate panel. The spacer pattern has a side edge close to the hollow portion as a second inner side edge and a side edge away from the hollow portion as a second outer side edge. The second inner side edge is closer to the hollow portion than the first inner side edge.

Another aspect of the present disclosure provides a fabrication method for the display panel. The method includes: providing a substrate panel, the substrate panel having a display region and a preset region; forming a display function layer on the substrate panel, where the display function layer is in the display region; forming an encapsulation layer on the display function layer to cover the display function layer, where a portion of the encapsulation layer extends into the preset region; and removing a portion of the display panel in the preset region to form a hollow portion. Before forming the encapsulation layer, at least one spacer part is formed between the display region and the preset region. A bottom pattern is an orthographic projection, on the substrate panel, of a bottom surface of the spacer part close to the substrate panel; and the bottom pattern has a side edge close to the hollow portion as a first inner side edge and a side edge away from the hollow portion as a first outer side edge. A spacer pattern is an orthographic projection of the spacer part on the substrate panel, and the spacer pattern has a side edge close to the hollow portion as a second inner side edge and a side edge away from the hollow portion as a second outer side edge. The second inner side edge is closer to the hollow portion than the first inner side edge. The encapsulation layer includes at least one inorganic layer, and a portion of the encapsulation layer extends to the spacer part and covers a side surface of the spacer part away from the substrate panel. The encapsulation layer is disconnected on the side surface of the spacer part away from the substrate panel to form a first edge.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
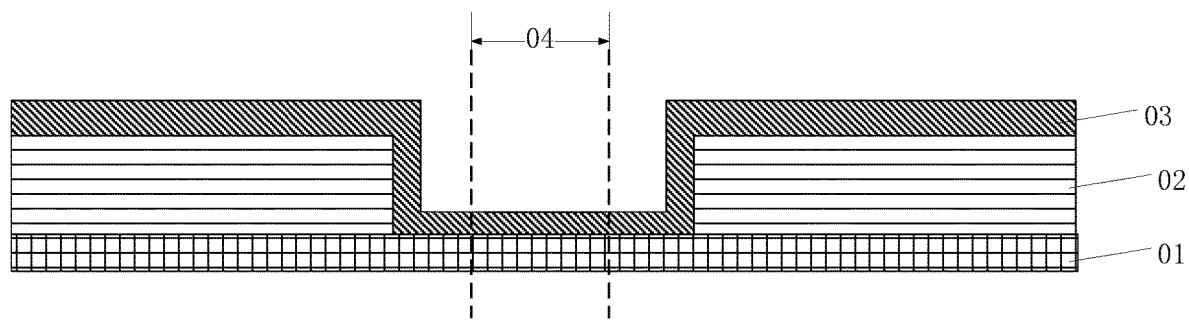
FIG. 1 illustrates a cross-sectional view of a display panel.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the invention. Furthermore, a three-dimensional (3D) size including length, width and depth should be considered during practical fabrication.

FIG. 1 illustrates a display panel including a substrate panel 01, a display layer 02 on the substrate panel 01, and an encapsulation layer 03 covering the display layer 02. The display panel can be cut along dashed lines in FIG. 1, to form a hollow portion in the display panel and an irregularly-shaped display panel.

However, the encapsulation performance at the hollow portion in the display panel is often problematic and sometimes an encapsulation failure may occur. Reliability of the display panel is seriously reduced.

As shown in FIG. 1, after forming the substrate panel 01, the display layer 02, and the encapsulation layer 03, a part of the display panel in region 04 is removed to form a hollow portion. The encapsulation layer 03 usually includes inorganic material layers. Cracks are easily formed in the inorganic material layers after cutting, and the cracks can easily spread further. Correspondingly, the encapsulation performance at the hollow portion in the display panel is further reduced and the encapsulation failure may further occur.

Figure 2:
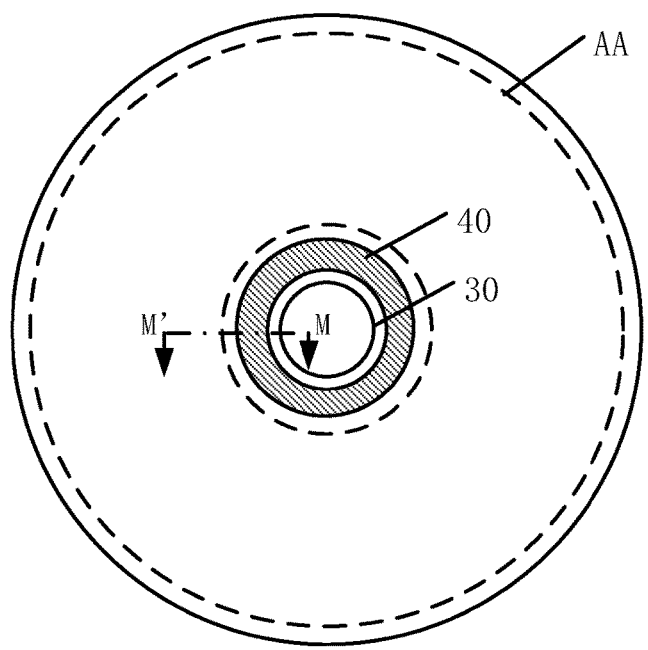
FIG. 2 illustrates a structure of an exemplary display panel consistent with various disclosed embodiments in the present disclosure.
Figure 3:
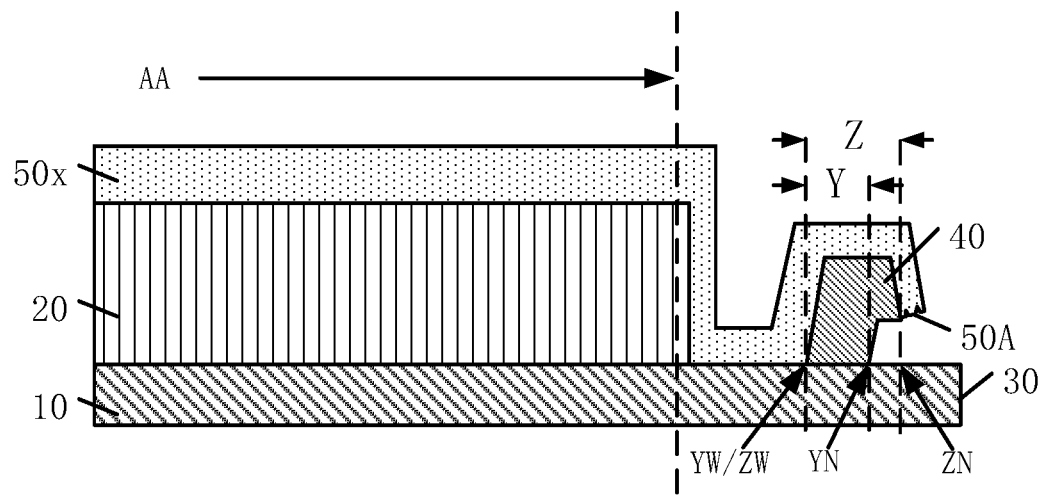
FIG. 3 illustrates a cross-sectional view of the display panel along an M-M' line in FIG. 2 consistent with disclosed embodiments in the present disclosure.

The present disclosure provides a display panel. In one embodiment, as illustrated in FIGS. 2-3, the display panel may include: a display region AA, a substrate panel 10, a display function layer 20 in the display region AA and over the substrate panel 10; a hollow portion 30; and at least one spacer part 40 configured between the display region AA and the hollow portion 30. The hollow portion 30 may penetrate through the display panel along a direction perpendicular to a surface of the substrate panel 10. A bottom pattern Y may be an orthographic projection on the substrate panel, of a bottom surface of the spacer part 40 close to the substrate panel 10. The bottom pattern Y may have a side edge close to the hollow portion 30 as a first inner side edge YN, and a side edge away from the hollow portion 30 as a first outer side edge YW. A spacer pattern Z may be an orthographic projection of the spacer part 40 on the substrate panel 10. The spacer pattern Z may have a side edge close to the hollow portion 30 as a second inner side ZN, and a side edge away from the hollow portion 30 as a second outer side edge ZW. The second inner side edge ZN may be closer to the hollow portion 30 than the first inner side edge.

The present closure is described using an embodiment where an outer edge of the display panel is circular and the display area AA is circular for example only. There is no limitation on the shape of the display panel and the display area, any shaped display panel, and display area may be encompassed according to various embodiments of the present disclosure.

In one embodiment, the substrate panel 10 may be made of a flexible material including a polymer, such as a polyimide, to form the flexible and bendable display panel.

The display function layer 20 may include a plurality of display units including, for example, a plurality of pixels.

The present closure is described by using an embodiment where the hollow portion 30 in the display panel is circular for example only. There is no limitation on the shape of the hollow portion 30, and the shape of the hollow portion 30 may be determined by a design requirement of the display panel. In various embodiments, the shape of the hollow portion 30 may be a triangle, a rectangle, or any other irregular shapes. In one embodiment, the display area AA may surround the hollow portion 30 and the spacer part 40 may surround the hollow portion 30.

The spacer part 40 in the display panel may have an irregular cross-section. In one embodiment, the second inner side edge ZN may be closer to the hollow portion 30 than the first inner side edge YN. Correspondingly, the cross-section of the spacer part 40 in FIG. 3 may have a narrower bottom and a wider top. A portion of the cross-section of the spacer part 40 close to the substrate panel 10 may be narrower than another portion of the cross-section of the spacer part 40 away from the substrate panel 10. And the top of the cross-section of the spacer part 40 may be wider than the bottom of the cross-section of the spacer part 40 at a side close to the hollow portion 30.

An inorganic film layer 50x may be formed subsequently. Because the cross-section of the spacer part 40 in FIG. 3 may have the narrower bottom and the wider top, and the top of the cross-section of the spacer part 40 may be wider than the bottom of the cross-section of the spacer part 40 at a side close to the hollow portion 30, the inorganic film layer 50x may be disconnected when forming the inorganic film layer 50x on the display panel. The disconnection of the inorganic film layer 50x may happen on a side surface of the spacer part 40 away from the substrate panel 10.

Because the inorganic film layer 50x may be disconnected on the side surface of the spacer part 40 away from the substrate panel 10, a cutting process may not damage the inorganic film layers 50 and cracks in the inorganic film layers 50 may be avoided when cutting the display panel to form the hollow portion 30. A display performance and a reliability of the display panel may be improved.

The inorganic film layer 50x may have a single-layer structure or a multi-layer structure.

In various embodiments, the second outer side edge ZW may be coincident with the first outer side edge YW or may be at a side of the first outer side edge YW away from the hollow portion 30.

Figure 4:
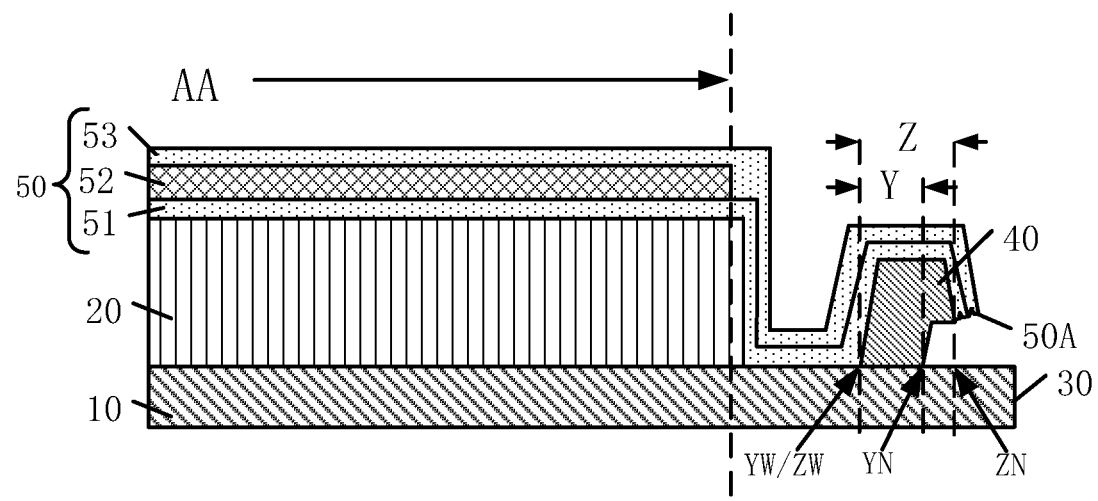
FIG. 4 illustrates a cross-sectional view of another exemplary display panel consistent with disclosed embodiments in the present disclosure.

In one embodiment, as illustrated in FIG. 4, the display panel may further include an encapsulation layer 50 covering the display function layer 20. The encapsulation layer 50 may include at least one inorganic layer, and may extend into the spacer part 40 to cover the side surface of the spacer part 40 away from the substrate panel 10. An edge of the encapsulation layer 50 close to the hollow portion 30 may be a first edge 50A, and the first edge 50A may be on a side surface of the spacer part 40 away from the substrate panel 10.

In one embodiment, the encapsulation layer 50 may be made of an inorganic layer. In other embodiments, the encapsulation layer 50 may include a plurality of film layers stacked together, and a plurality of the film layers may include at least one inorganic layer. In one embodiment, the inorganic film layer 50x may include at least one inorganic layer in the encapsulation layer 50. For example, in one embodiment, the encapsulation layer 50 may include an inorganic layer 51 and another inorganic layer 53, as well as an organic layer 52 between the inorganic layer 51 and the inorganic layer 53. The inorganic film layer 50x may include the inorganic layer 51 and the inorganic layer 53. The inorganic layer 51 and the inorganic layer 53 may extend into the spacer part 40 to cover the side surface of the spacer part 40 away from the substrate panel 10.

The encapsulation layer 50 may be formed by an evaporation method or a chemical vapor deposition method. A material of the encapsulation layer 50 may be deposited on the display panel from the top of the display panel, to form the encapsulation layer 50 covering the display function layer 20 and extending into the spacer part 40 to cover the side surface of the spacer part 40 away from the substrate panel 10. Because the cross-section of the spacer part 40 in FIG. 3 may have the narrower bottom and the wider top, and the top of the cross-section of the spacer part 40 may be wider than the bottom of the cross-section of the spacer part 40 at a side close to the hollow portion 30, the encapsulation layer 50 may be disconnected when forming the encapsulation layer 50 on the display panel. The disconnection of the encapsulation layer 50 may happen on a side surface of the spacer part 40 away from the substrate panel 10.

Because the encapsulation layer 50 may be disconnected on the side surface of the spacer part 40 away from the substrate panel 10 and the first side 50A may be naturally formed in the encapsulation layer 50, a cutting process may not damage the encapsulation layer 50 and cracks in the encapsulation layer 50 may be avoided when cutting the display panel to form the hollow portion 30. A display performance and a reliability of the display panel may be improved.

In various embodiments, a distance between the first inner side edge and the second inner side edge may be about 1 μm to about 3 μm. In one embodiment, the distance between the first inner side edge YN and the second inner side edge ZN may be at least 1 μm. Correspondingly, a distance between the second inner side edge ZN and the hollow portion 30 may be larger than a distance between the first inner side edge YN and the hollow portion 30. The cross-section of the spacer part 40 may have a large difference between a top width and a bottom width, and the natural disconnection of the encapsulation layer 50 may be improved.

If the distance between the first inner side edge YN and the second inner side edge ZN is smaller than 1 µm, the cross-section of the spacer part 40 may have a small difference between the top width and the bottom width, and the natural disconnection of the encapsulation layer 50 may still extend to another side of the spacer part 40 close to the hollow portion 30, along the surface of the spacer part 40.

The difference between the top width and the bottom width in the cross-section of the spacer part 40 should not be too large. When the distance between the first inner side edge YN and the second inner side edge ZN is larger than 3 µm, the process may have a large difficulty and a large complexity. In one embodiment, the difference between the top width and the bottom width in the cross-section of the spacer part 40 may be smaller than 3 µm. A difficulty in the process may be reduced and the process efficiency may be improved.

Figure 5:
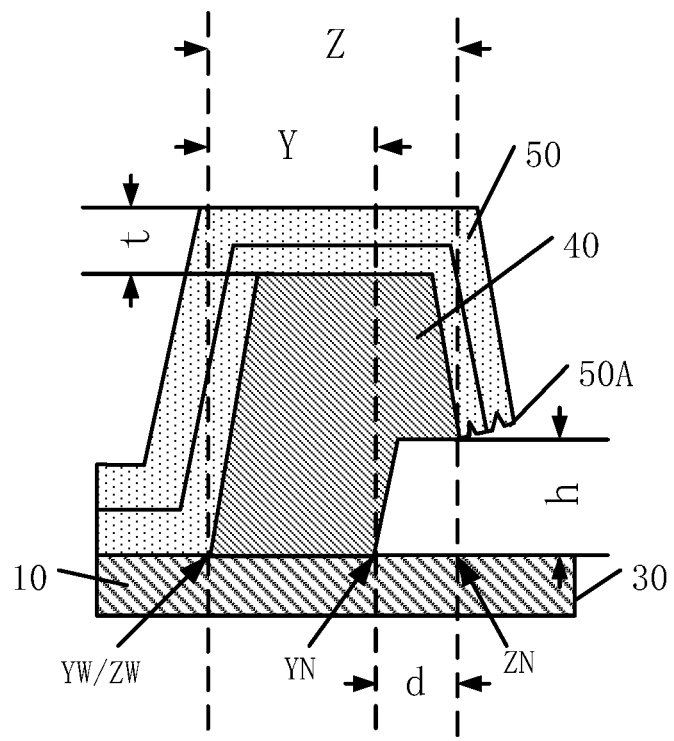
FIG. 5 illustrates a structure of a spacer part of the display panel in FIG. 4 consistent with disclosed embodiments in the present disclosure.
Figure 6:
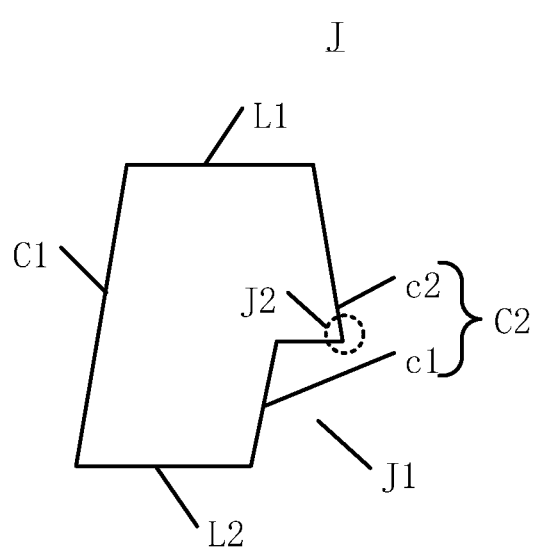
FIG. 6 illustrates a cross-sectional view of the spacer part in FIG. 5 consistent with disclosed embodiments in the present disclosure.

In one embodiment, as illustrated in FIGS. 5-6, the cross-section of the spacer part 40 may be a cross-sectional pattern J. The cross-sectional pattern J may include a top edge L1 and a bottom edge L2 opposing each other, and a first side edge C1 and a second side edge C2 opposing each other.

The bottom edge L2 may be located at a side of the cross-sectional pattern J close to the substrate panel 10, and the top edge L1 may be located at aside of the cross-sectional pattern J away from the substrate panel 10.

The second side edge C2 may be located at a side of the first side edge C1 close to the hollow portion 30, and a first end of the first side edge C1 may be connected to a first end of the top edge L1. A second end of the first side edge C1 may be connected to a first end of the bottom edge L2.

The second side edge C2 may include a first segment c1 and a second segment c2. A first end of the first segment c1 may be connected to a second end of the bottom edge L2, and a first end of the second segment c2 may be connected to a second end of the top edge L1.

The first segment c1 may be recessed toward the inside of the cross-sectional pattern J, to form a notched portion J1. A second end of the first segment c1 may be connected to a second end of the second segment c2, to form a sharp corner J2. The sharp corner J2 may protrude toward the outside of the cross-sectional pattern J.

The top edge L1 and the bottom edge L2 may be parallel to each other. The first segment c1 may be recessed toward the inside of the cross-sectional pattern J, to form the notched portion J1. The second end of the first segment c1 may be connected to the second end of the second segment c2, to form the sharp corner J2. Correspondingly, when the material of the encapsulation layer 50 is deposited on the display panel to form the encapsulation layer 50, the encapsulation layer 50 cannot extend continuously at the sharp corner J2 and then can be disconnected because the first segment c1 and the second segment are not continuous at the crossing point. A smaller angle of the sharp corner J2 may benefit the natural disconnection of the encapsulation layer 50 more effectively.

A distance between an apex of the sharp corner J2 and the substrate panel 10 may be denoted as h, and a portion of the encapsulation layer 50 on the surface of the spacer part 40 away from the substrate panel 10 may have a thickness t. h may be larger than t. In one embodiment, the distance between an apex of the sharp corner J2 and the substrate panel 10 may be larger than the thickness of the portion of the encapsulation layer 50 on the surface of the spacer part 40 away from the substrate panel 10. Correspondingly, a height of the notched portion J1 may be increased, and the natural disconnection of the encapsulation layer 50 may be improved further. An encapsulation performance of the display panel and the reliability of the display panel may be improved further.

In other embodiments, the cross-section of the spacer part 40 may have other different shapes.

Figure 7:
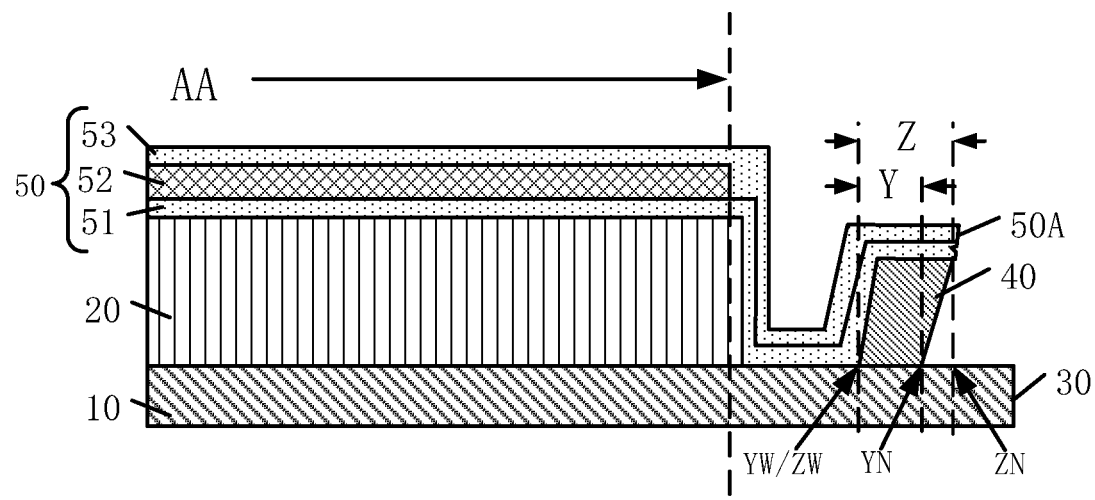
FIG. 7 illustrates a cross-sectional view of another exemplary display panel consistent with disclosed embodiments in the present disclosure.

In another embodiment, the cross-section of the spacer part 40 may have another shape illustrated in FIG. 7. In FIG. 7, the cross-section of the spacer part 40 may be a rectangle, and the encapsulation layer 50 may be disconnected on the side surface of the spacer part 40 away from the substrate panel 10.

Figure 8:
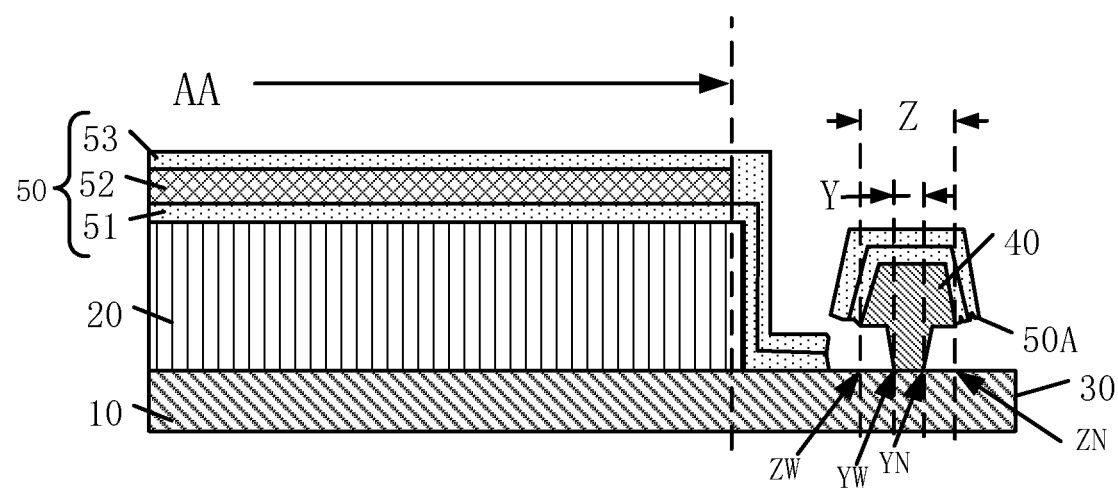
FIG. 8 illustrates a cross-sectional view of another exemplary display panel consistent with disclosed embodiments in the present disclosure.

In another embodiment, the cross-section of the spacer part 40 may have another shape illustrated in FIG. 8. In FIG. 8, the cross-section of the spacer part 40 may have a "T" shape, and may include two notched portions and two sharp corners. The orthographic projection of the bottom surface of the spacer part 40 close to the substrate panel 10 on the substrate panel 10 may be the bottom pattern Y. The side edge of the bottom pattern Y close to the hollow portion 30 may be the first inner side edge YN, and another side edge of the bottom pattern Y away from the hollow portion 30 may be the first outer side edge YW. The orthographic projection of the spacer part 40 on the substrate panel 10 may be the spacer pattern Z. The side edge of the spacer pattern Z close to the hollow portion 30 may be the second inner side ZN, and another side edge of the spacer pattern Z away from the hollow portion 30 may be the second outer side ZW. The second inner side edge ZN may be at a side of the first inner side YN close to the hollow portion 30, and the second outer side edge ZW may be at a side of the first outer side edge YW away from the hollow portion 30. In the display panel illustrated in FIG. 8, the encapsulation layer 50 may be disconnected on the side surface of the spacer part 40 away from the substrate panel 10. Further, the encapsulation layer 50 may be disconnected on a side of the spacer part 40 away from the hollow portion 30, and on another side of the spacer part 40 close to the hollow portion 30.

The present disclosure is described by using previous embodiments where the cross-section of the spacer part has a different shape as examples only, and should not limit the scope of the present disclosure.

Figure 9:
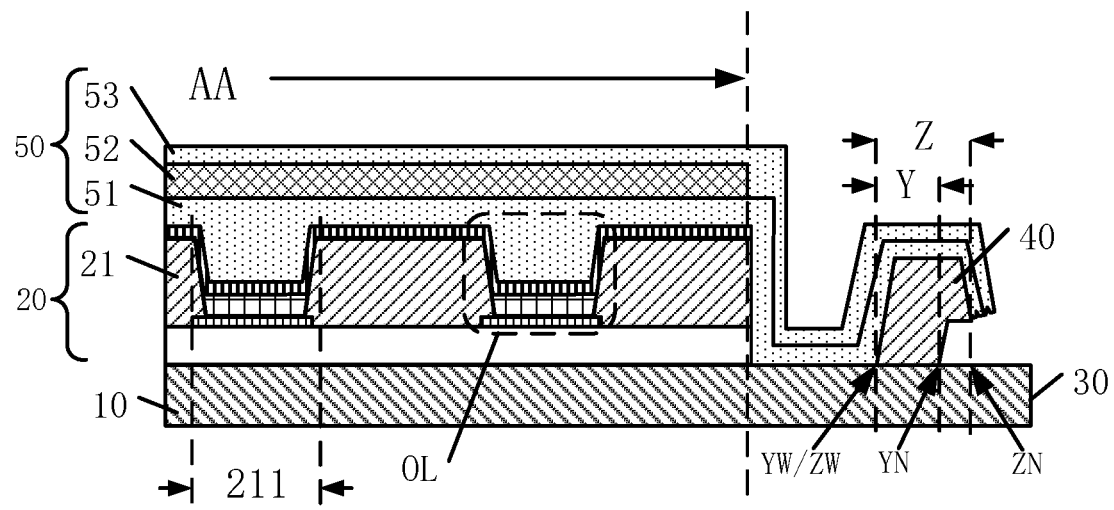
FIG. 9 illustrates a cross-sectional view of another exemplary display panel consistent with disclosed embodiments in the present disclosure.

In one embodiment, the spacer part 40 may have a layer structure illustrated in FIG. 9. The display function layer 20 may include a light emitting device layer. The light emitting device layer may include a plurality of organic light emitting diodes OL. In FIG. 9, the present disclosure is illustrated by using the light emitting device layer including two organic light emitting diodes OL as an example. There is no limitation on the scope of the present disclosure, and the light emitting device layer may include a plurality of the organic light emitting diodes OL. The plurality of the organic light emitting diodes OL may have a plurality of colors. Each organic light emitting diode OL may include an anode, a cathode, and a light emitting material between the anode and the cathode.

The light emitting device layer may further include a pixel definition layer 21. The pixel definition layer 21 may include a plurality of opening areas 211. The light emitting diodes OL may be in a portion of the opening areas 211.

The pixel definition layer 21 may be made of an organic material. The organic material may be used to form a thin film layer to make the spacer part 40 having an appropriate height. Correspondingly, the natural disconnection of the encapsulation layer 50 on the side surface of the spacer part 40 away from the substrate panel 10 may be improved further.

In one embodiment, the spacer part 40 may have a single-layer structure and may be made of a material same as the pixel definition layer 21.

In other embodiments, the spacer part 40 may include a plurality of sub film layers stacked together and a sub film layer may be made of a material same as the pixel definition layer 21.

FIG. 9 illustrates a structure of the spacer part 40 with a single-layer structure. When forming the display panel consistent with the present embodiment of the present disclosure, the pixel definition layer 21 and the spacer part 40 may be formed by patterning a single material layer in a single process. An additional process and an additional material layer to form the spacer part 40 may be reduced. Then a producing efficiency for forming the display panel may be improved and a cost of the display panel may be reduced.

Figure 10:
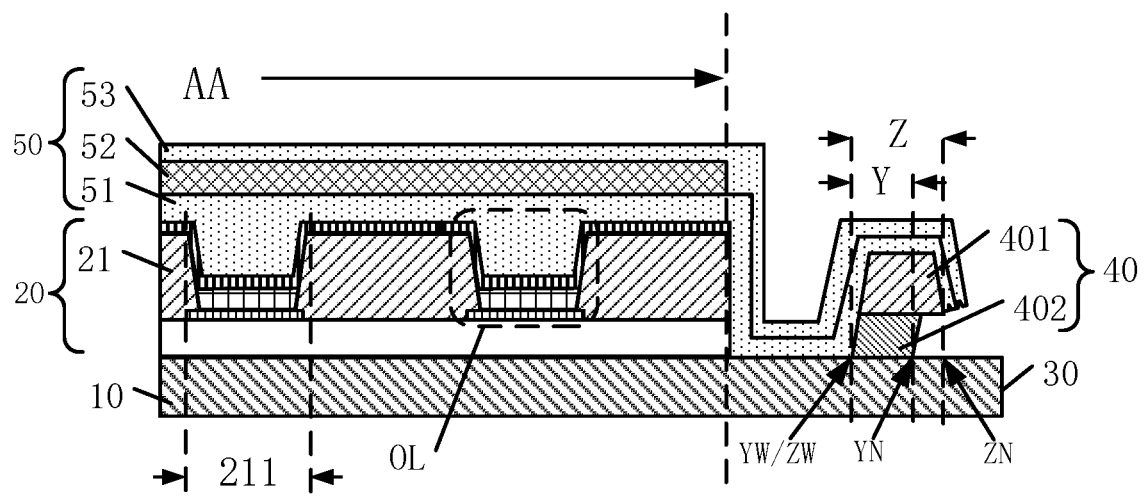
FIG. 10 illustrates a cross-sectional view of another exemplary display panel consistent with disclosed embodiments in the present disclosure.

In other embodiments, the spacer part 40 may include a plurality of sub film layers stacked together. As illustrated in FIG. 10, in one embodiment, the spacer part 40 may include a sub film layer 401 and another sub film layer 402. The sub film layer 401 and the sub-film layer 402 may be stacked together, and one of the sub-film layer 401 and the sub-film layer 402 may be made of a material same as the pixel definition layer 21. When forming the display panel consistent with the present embodiment of the present disclosure, the pixel definition layer 21 and a sub film layer in the spacer part 40 may be formed by patterning a single material layer in a single process. An additional process and an additional material layer to form a sub film layer in the spacer part 40 may be reduced. Then a producing efficiency for forming the display panel may be improved and a cost of the display panel may be reduced.

Figure 11:
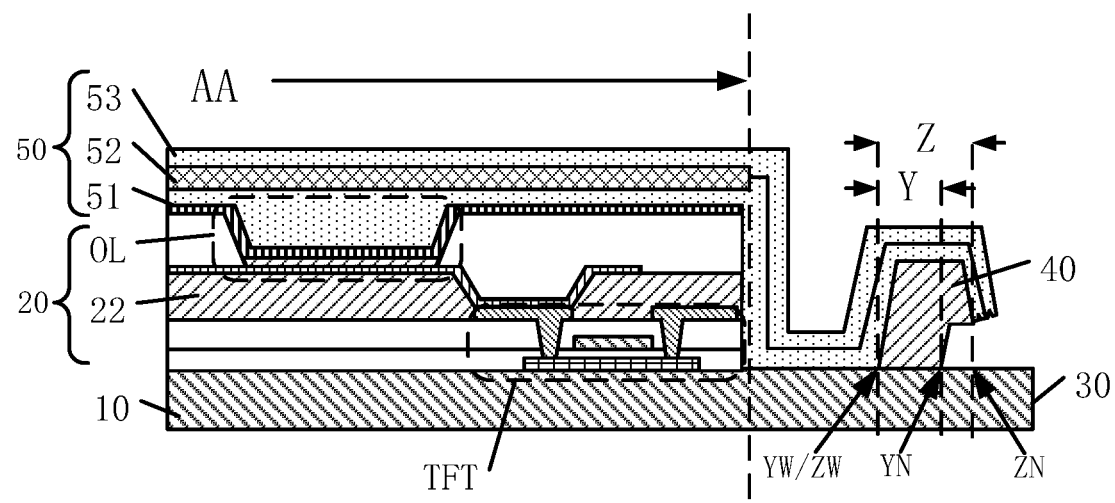
FIG. 11 illustrates a cross-sectional view of another exemplary display panel consistent with disclosed embodiments in the present disclosure.

In some other embodiments, the display panel may have a multi-layered structure illustrated in FIG. 11. The display function layer 20 may include a thin film transistor layer, a light emitting device layer, and a planarizing layer 22 between the thin film transistor layer and the light emitting device layer. The thin film transistor layer may include a plurality of thin film transistors TFT, and the light emitting device layer may include a plurality of organic light emitting diodes OL.

For description purposes, only one organic light emitting diode OL and one thin film transistor TFT are shown in FIG. 11. There is no limitation on the scope of the present disclosure, and the light emitting device layer may include a plurality of the organic light emitting diodes OL. The plurality of the organic light emitting diodes OL may have a plurality of colors. Each organic light emitting diode OL may include an anode, a cathode, and a light emitting material between the anode and the cathode. Each thin film transistor TFT may include a gate, a semiconductor portion, a source and a drain. Each organic light emitting diode OL may be connected to a thin film transistor TFT. The anode of each organic light emitting diode OL may be connected to the drain of the corresponding thin film transistor TFT.

The planarizing layer 22 may be made of an organic material. The organic material may be used to form a thick film layer to make the spacer part 40 having an appropriate height. Correspondingly, the natural disconnection of the encapsulation layer 50 on the side surface of the spacer part 40 away from the substrate panel 10 may be improved further.

In one embodiment, the spacer part 40 may have a single-layer structure and may be made of a material same as the planarizing layer 22.

In other embodiments, the spacer part 40 may include a plurality of sub film layers stacked together and a sub film layer may be made of a material same as the planarizing layer 22.

FIG. 11 illustrates a structure of the spacer part 40 with a single-layer structure. When forming the display panel consistent with the present embodiment of the present disclosure, the planarizing layer 22 and the spacer part 40 may be formed by patterning a single material layer in a single process. An additional process and an additional material layer to form the spacer part 40 may be reduced. Then a producing efficiency for forming the display panel may be improved and a cost of the display panel may be reduced.

Figure 12:
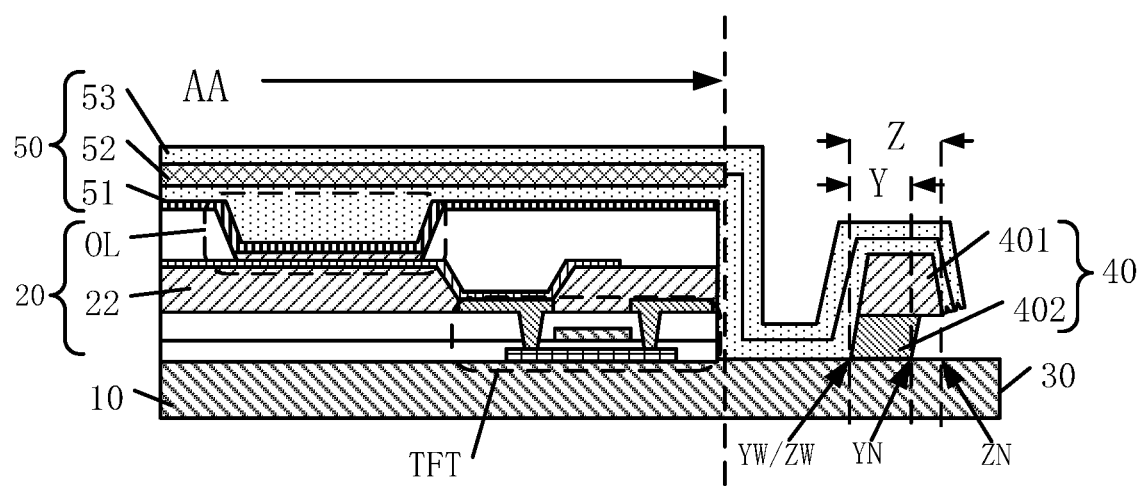
FIG. 12 illustrates a cross-sectional view of another exemplary display panel consistent with disclosed embodiments in the present disclosure.

In other embodiments, the spacer part 40 may include a plurality of sub-film layers stacked together. As illustrated in FIG. 12, in one embodiment, the spacer part 40 may include a sub-film layer 401 and another sub film layer 402. The sub-film layer 401 and the sub-film layer 402 may be stacked together, and one of the sub-film layer 401 and the sub-film layer 402 may be made of a material same as the planarizing layer 22. When forming the display panel consistent with the present embodiment of the present disclosure, the planarizing layer 22 and a sub-film layer in the spacer part 40 may be formed by patterning a single material layer in a single process. An additional process and an additional material layer to form a sub film layer in the spacer part 40 may be reduced. Then a producing efficiency for forming the display panel may be improved and a cost of the display panel may be reduced.

The present disclosure is described by using the display panel including the spacer part 40 with a layer structure illustrated in FIGS. 9-12 as examples, and there is no limitation on the scope of the present disclosure. The spacer part 40 may have other appropriate layer structures.

Figure 13:
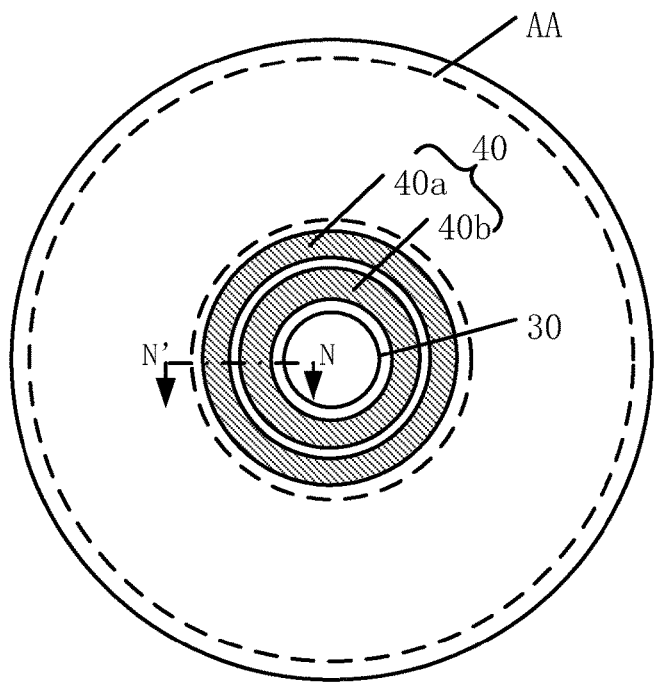
FIG. 13 illustrates a structure of another exemplary display panel consistent with disclosed embodiments in the present disclosure.
Figure 14:
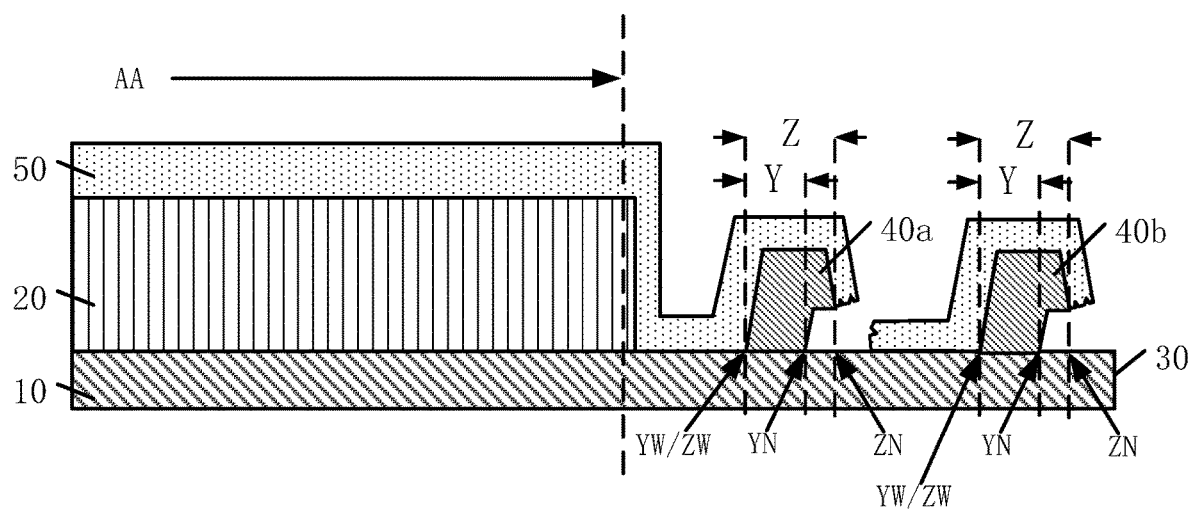
FIG. 14 illustrates a cross-sectional view of the display panel along an N-N' line in FIG. 13 consistent with disclosed embodiments in the present disclosure.

In some other embodiments, the display panel may include two spacer parts 40 as illustrated in FIGS. 13-14. The spacer parts 40 may include a first spacer part 40a and a second spacer part 40b. The second spacer part may be at a side of the first spacer part away from the hollow portion 30. The encapsulation layer 50 may be disconnected on a side surface of the spacer part 40a away from the substrate panel 10, and may be also disconnected on a side surface of the spacer part 40b away from the substrate panel 10. Since the display panel may include two spacer parts 40, if the encapsulation layer 50 is not disconnection effectively on the surface of a spacer part 40 because of some reasons including the process error, the encapsulation layer 50 may be still disconnected effectively on the surface of another spacer part 40. The reliability of the display panel may be improved.

Figure 15:
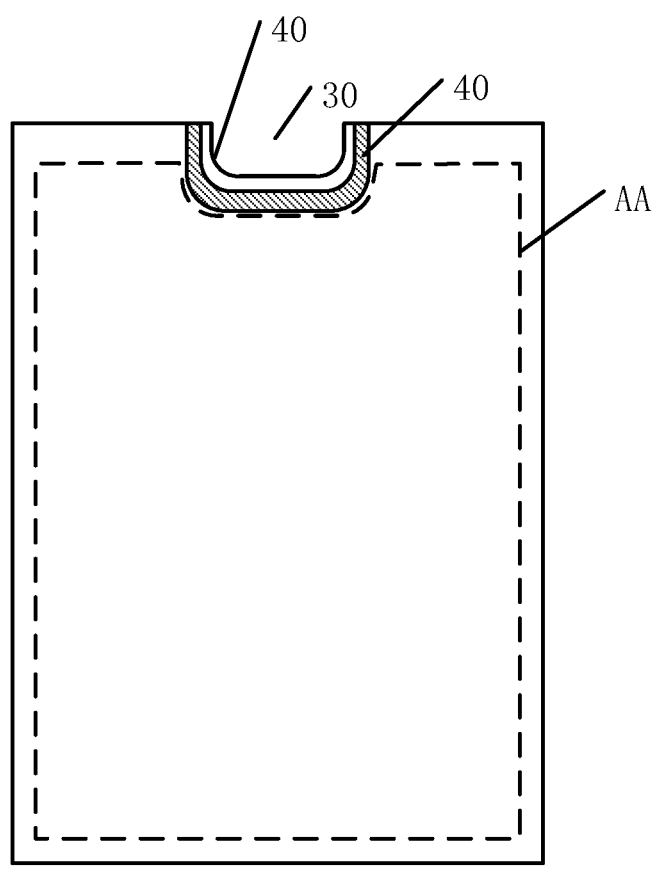
FIG. 15 illustrates a structure of another exemplary display panel consistent with disclosed embodiments in the present disclosure.

For description purposes, in FIGS. 2-3 and FIGS. 13-14, the present disclosure is described by using the display panel where the display region AA surrounding the hollow portion 30 and the spacer part 40 surrounding the hollow portion 30 as an example, and there is no limitation on the scope of the present disclosure. In some other embodiments, the hollow portion 30 and the spacer part 40 may be deployed as illustrated in FIG. 15. The display panel may have an irregular edge Y1, and the irregular edge Y1 may be recessed toward an inside of the display panel to form a hollow portion 30. In one embodiment, the irregular edge Y1 may be recessed toward the inside of the display panel to form a recession, and the recession may be used as the hollow portion 30. The spacer part 40 may have a "U" shape and may half surround the hollow portion 30.

When the display panel provided by various embodiments of the present disclosure is deployed in different display devices, various electronic devices including cameras, earpiece, and light sensors, may be formed in the hollow portion 30.

Figure 16:
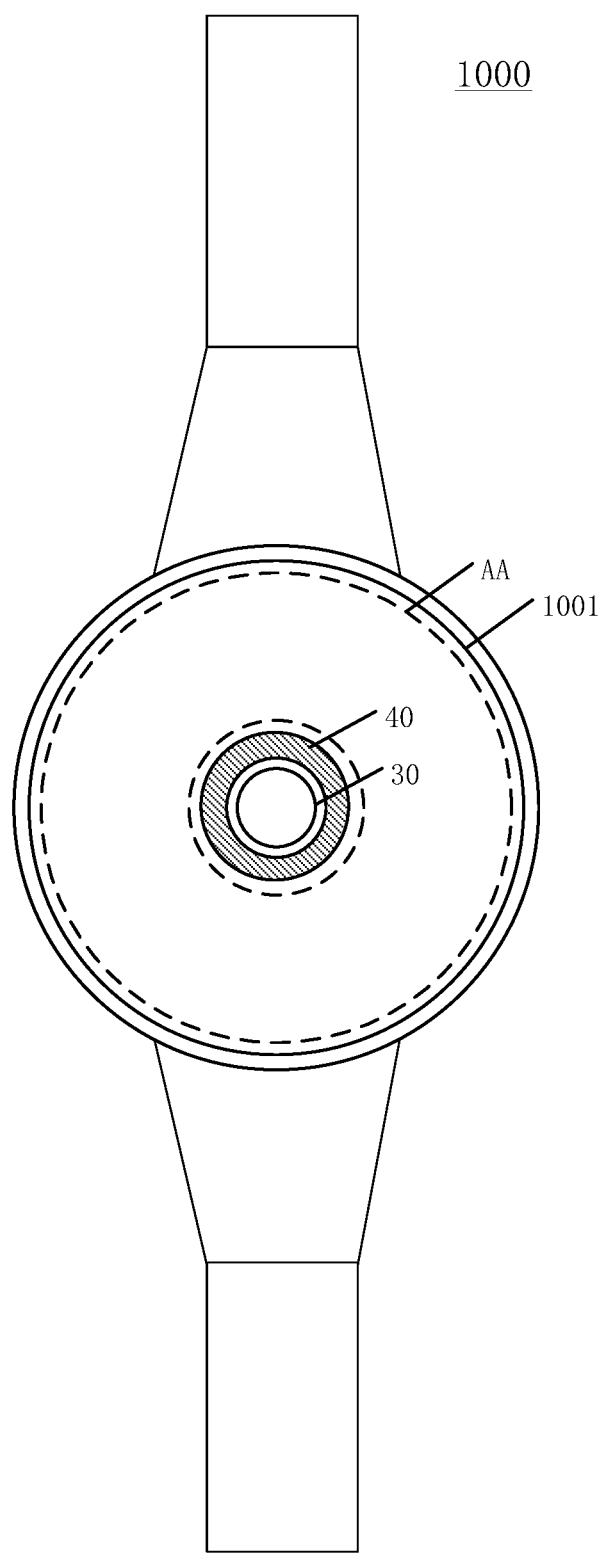
FIG. 16 illustrates a structure of an exemplary display device consistent with disclosed embodiments in the present disclosure.

The present disclosure also provides a display device including any display panel provided by various embodiments of the present disclosure. FIG. 16 illustrates a structure of a display device provided by the present disclosure, and the display device 1000 may include any display panel 1001 provided by various embodiments of the present disclosure. For description purposes, the display device in FIG. 16 is described by using a watch as an example, and there is no limitation on the scope of the present disclosure. The display device provided by the present disclosure may be a cell phone, a computer, a television, a vehicle display device, or other devices with display function. The display device provided by the present disclosure may have advantages of the display panel provided by the present disclosure and can refer to the previous description.

Figure 17:
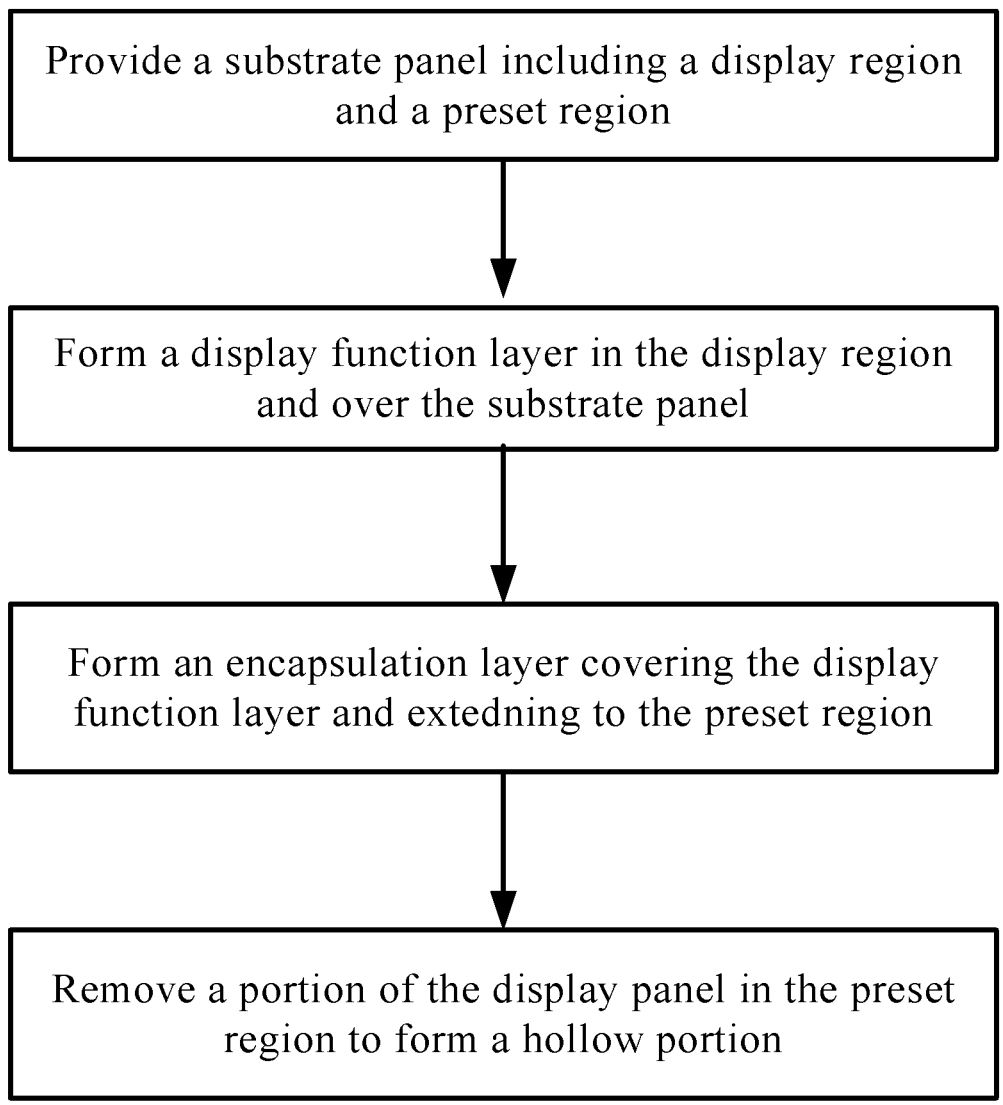
FIG. 17 illustrates an exemplary fabrication method for a display panel consistent with disclosed embodiments in the present disclosure.
Figure 18:
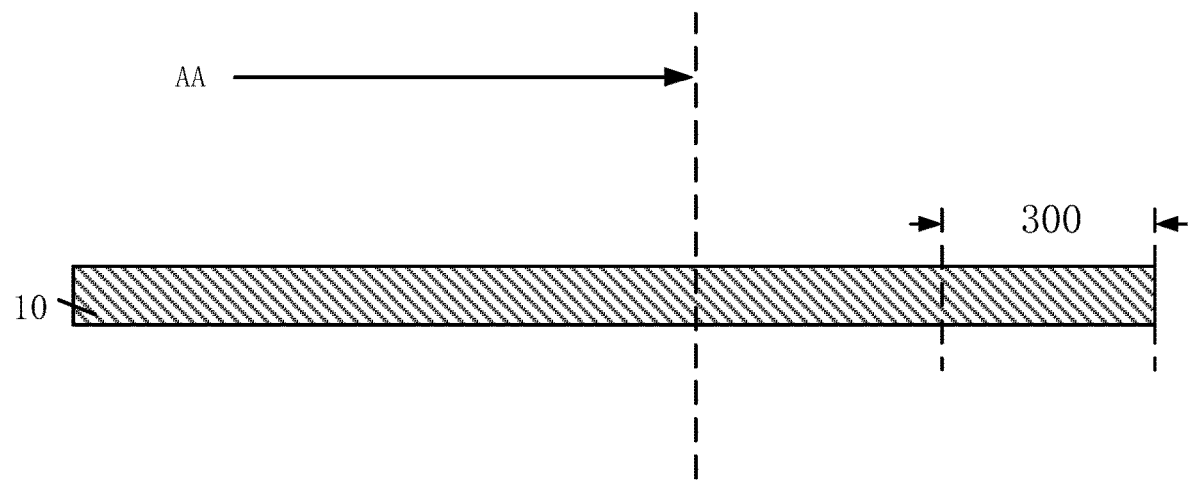
FIGS. 18-21 illustrate cross-sectional structures of the display panel corresponding to various stages in FIG. 17 consistent with disclosed embodiments in the present disclosure.
Figure 19:
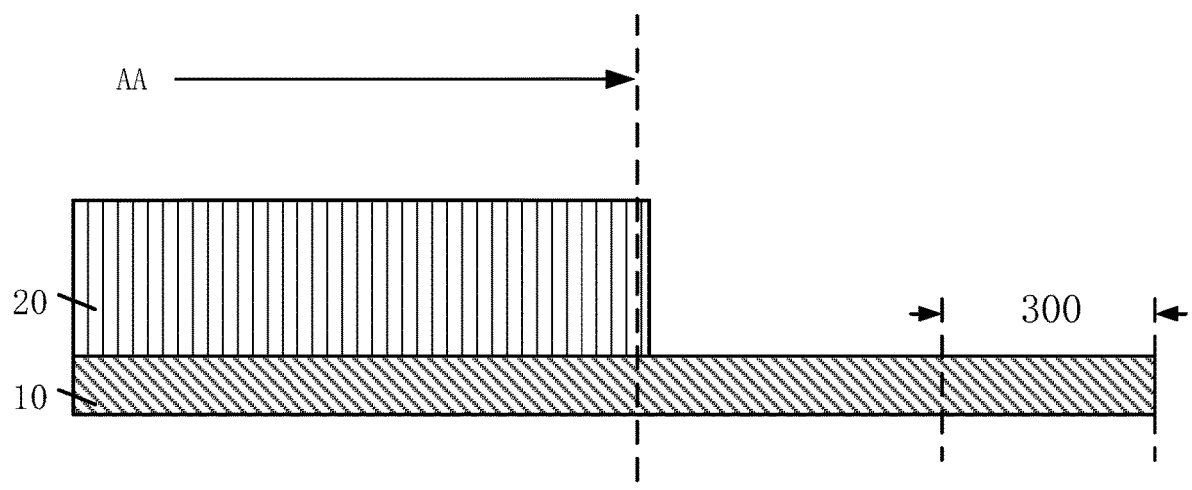
Figure 20:
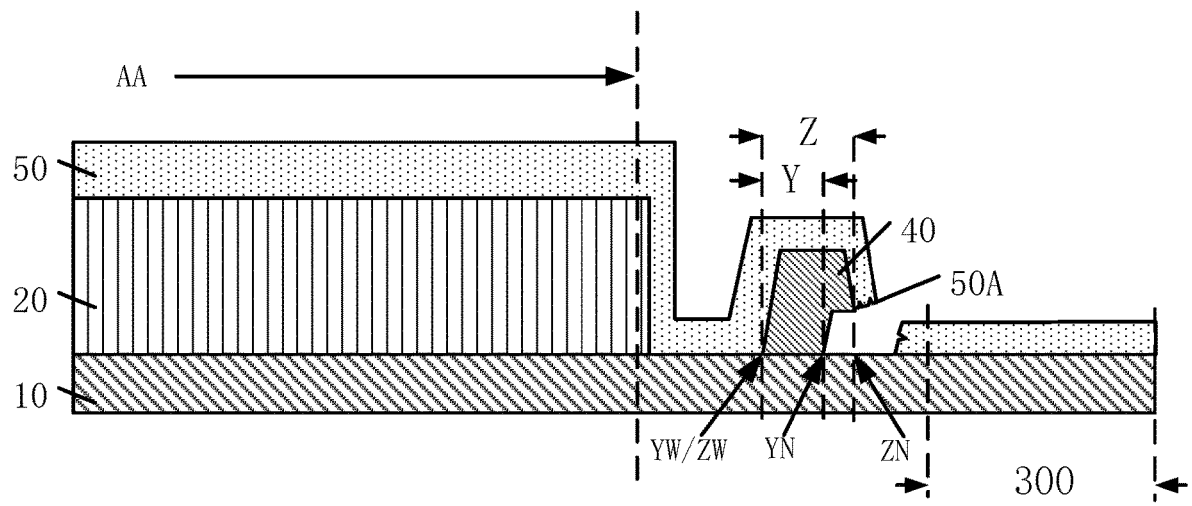
Figure 21:
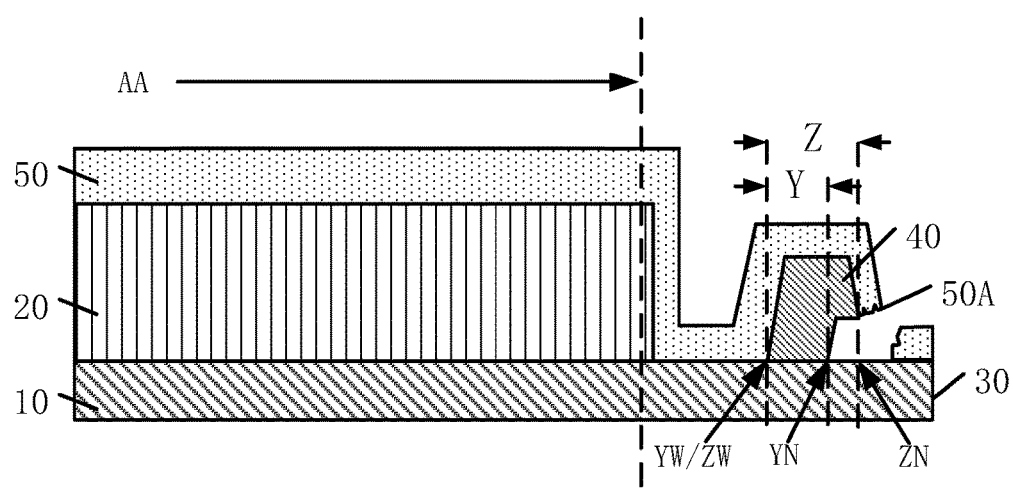
Figure 22:
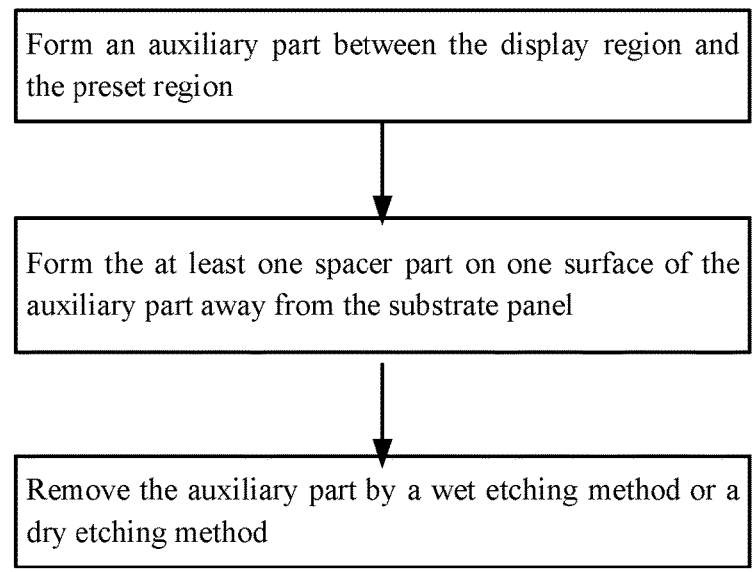
FIG. 22 illustrates another exemplary fabrication method for a display panel consistent with disclosed embodiments in the present disclosure.
Figure 23:
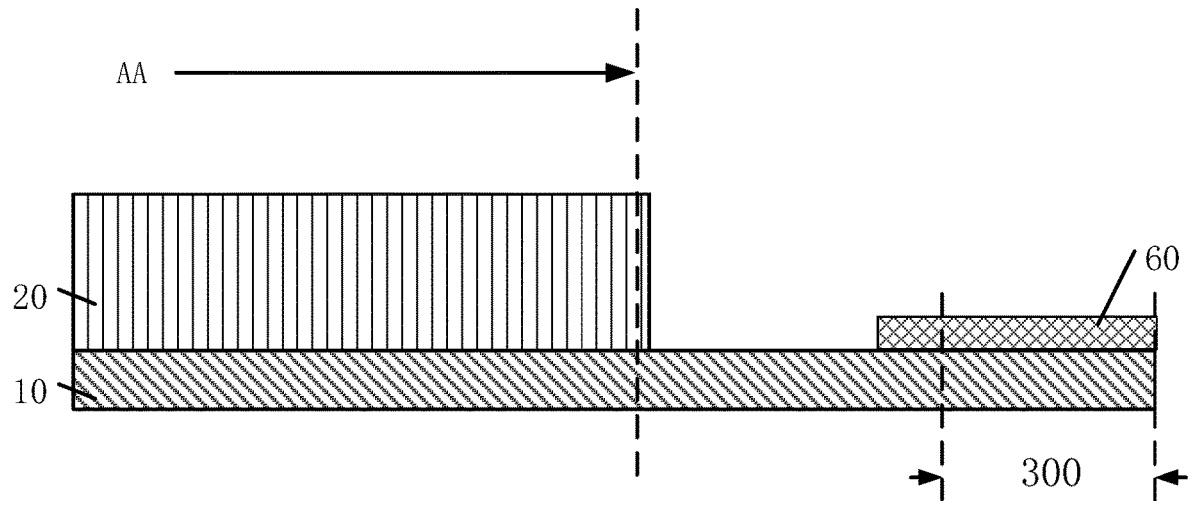
FIGS. 23-25 illustrate cross-sectional structures of the display panel corresponding to various stages in FIG. 22 consistent with disclosed embodiments in the present disclosure.
Figure 24:
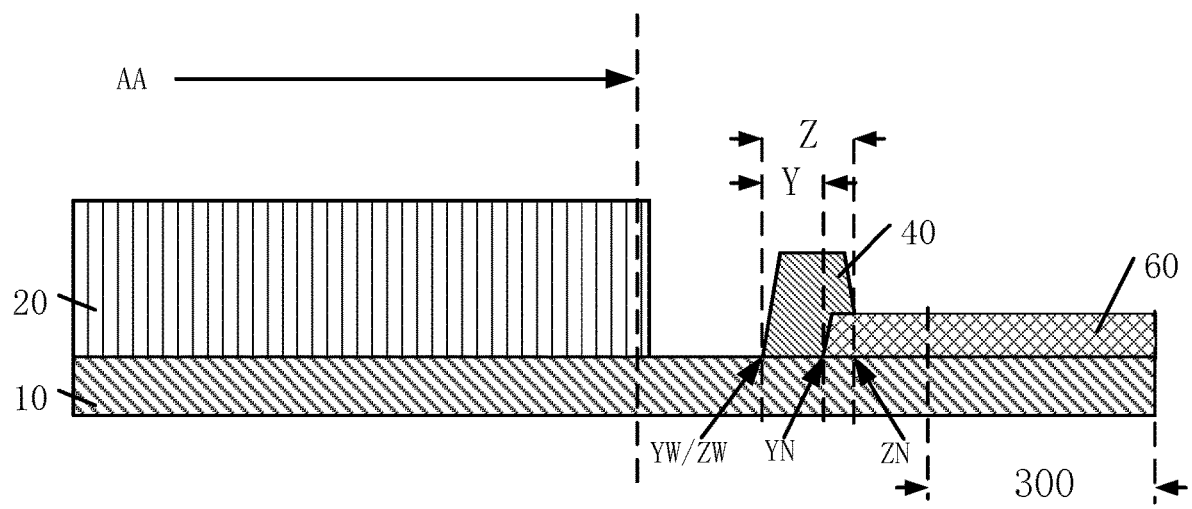
Figure 25:
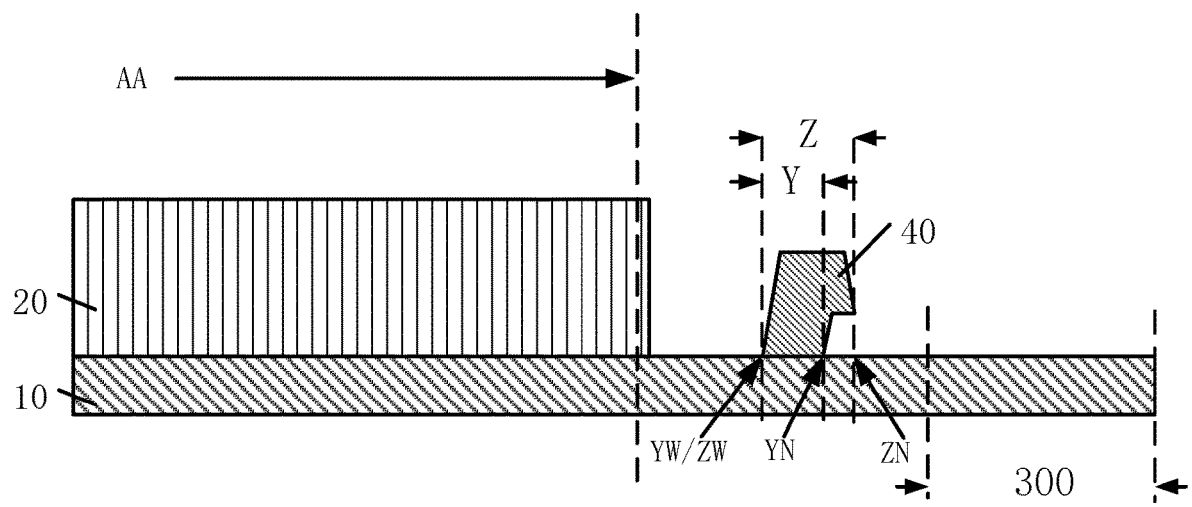
Figure 26:
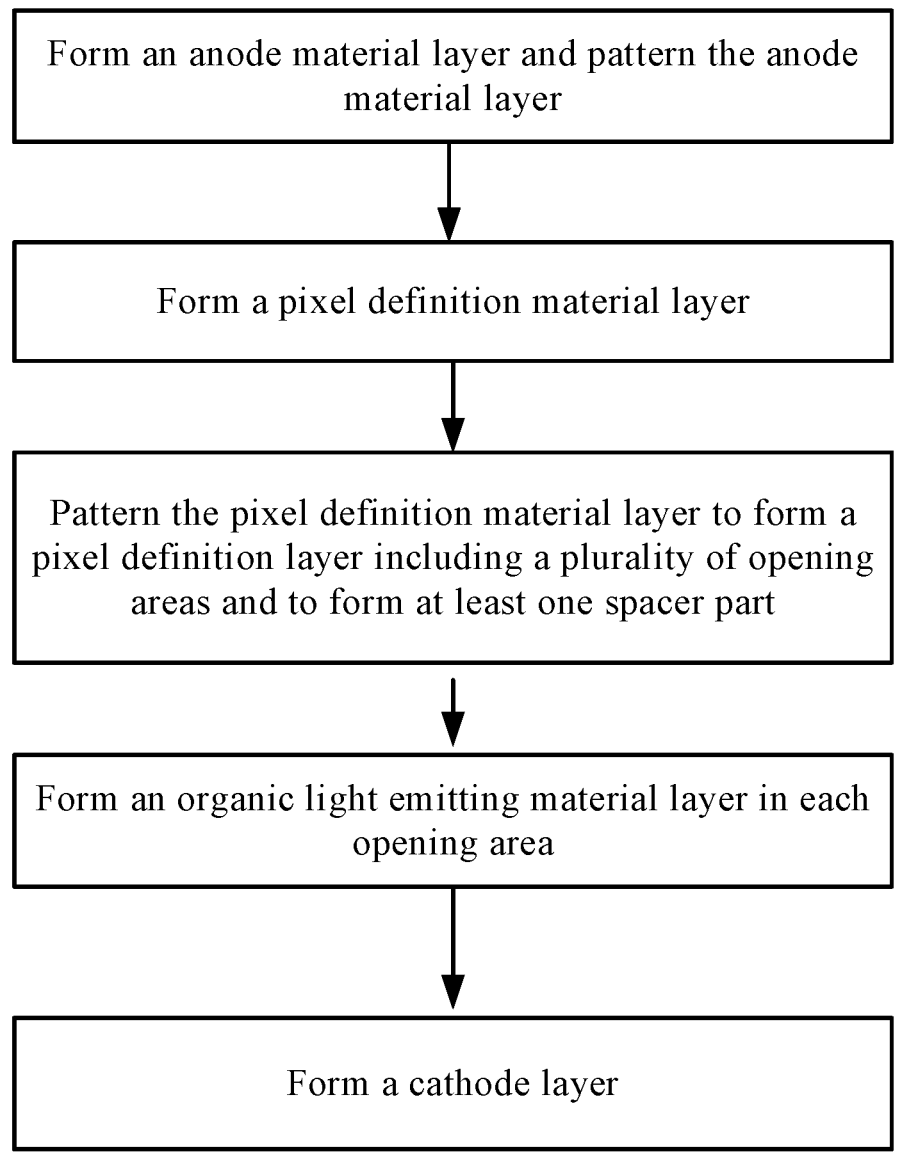
FIG. 26 illustrates another exemplary fabrication method for a display panel consistent with disclosed embodiments in the present disclosure.
Figure 27:
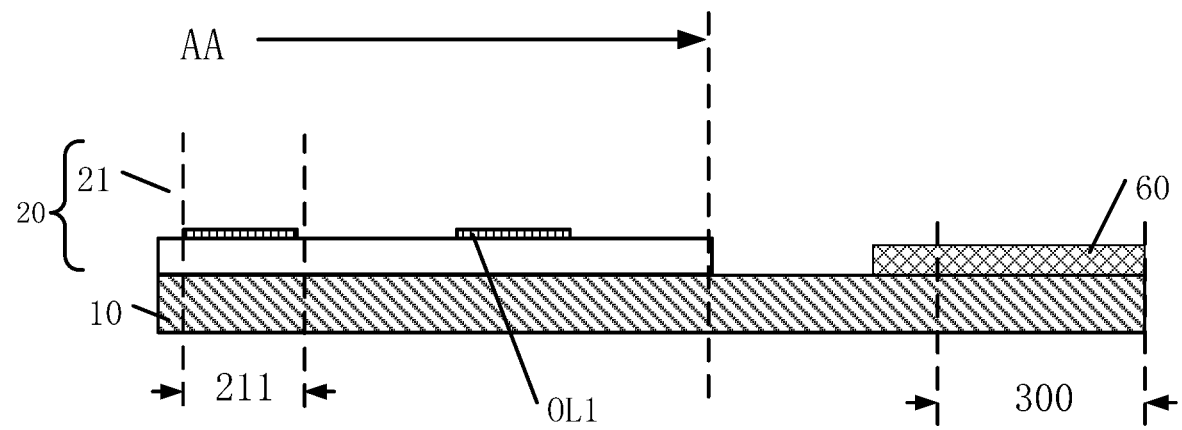
FIGS. 27-30 illustrate cross-sectional structures of the display panel corresponding to various stages in FIG. 26 consistent with disclosed embodiments in the present disclosure.
Figure 28:
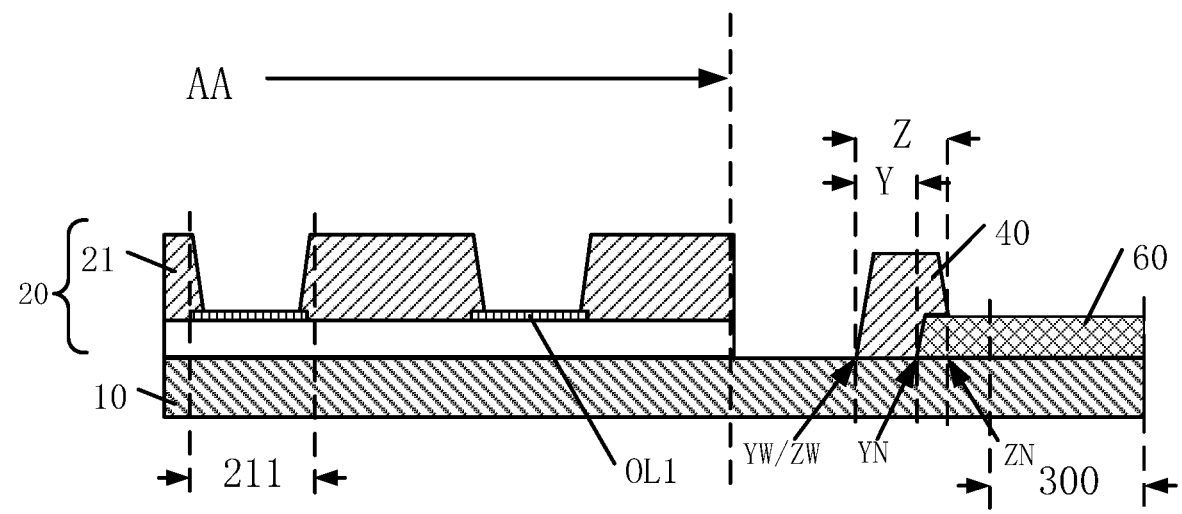
Figure 29:
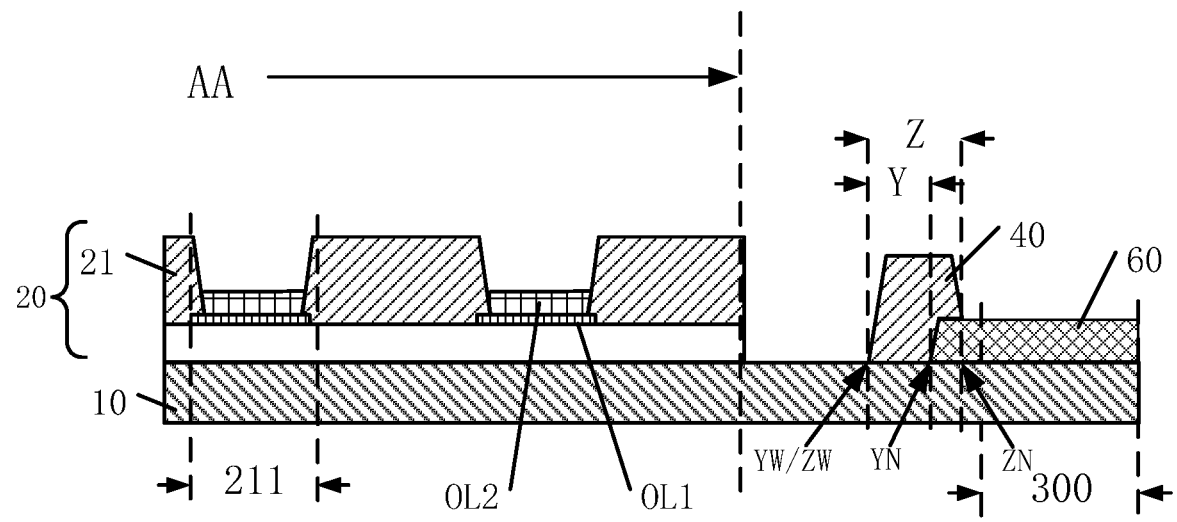
Figure 30:
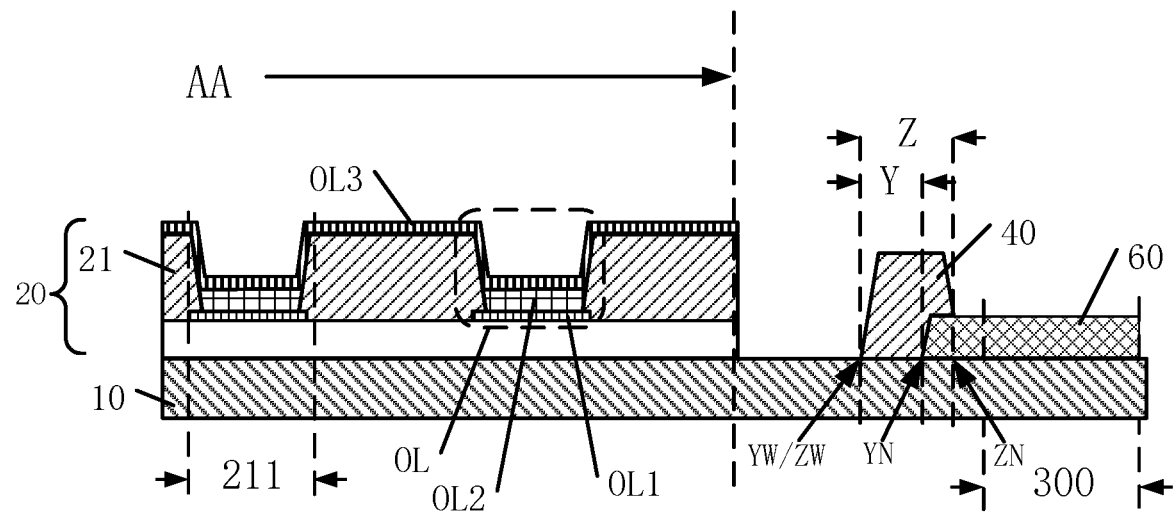

The present disclosure provides a fabrication method for a display panel. As illustrated in FIG. 17, FIG. 18 and FIG. 21, the method may include: providing a substrate panel 10 including a display region AA and a preset region 300; forming a display function layer 20 in the display region AA of the substrate panel 10; forming a encapsulation layer 50 on the display function layer 20; and forming a hollow portion 30 by removing a portion of the display panel in the preset region 300. The encapsulation layer 50 may cover the display function layer 20 and may extend into the preset region 300.

Before forming the encapsulation layer 50, the method may further include forming at least one spacer part 40 between the display region AA and the preset region 300. A bottom pattern Y may be an orthographic projection on the substrate panel 10, of a bottom surface of the spacer part 40 close to the substrate panel 10 on the substrate panel 10. The bottom pattern Y may have a side edge of the bottom pattern Y close to the preset region 300 as a first inner side edge YN, and another side edge of the bottom pattern Y away from the preset region 300 as a first outer side edge YW. An orthographic projection of the spacer part 40 on the substrate panel 10 may be a spacer pattern Z. A side edge of the spacer pattern Z close to the preset region 300 may be a second inner side edge ZN, and a side edge of the spacer pattern Z away from the preset region 300 may be a second outer side edge ZW. The second inner side edge ZN may be closer to the preset region 300 than the first inner side edge YN. The encapsulation layer 50 may include at least one inorganic layer. A portion of the encapsulation layer 50 may extend into the spacer part 40 and cover a side surface of the spacer part 40 away from the substrate panel 10. The encapsulation layer 50 may be disconnected on the side surface of the spacer part 40 away from the substrate panel 10, to form a first edge 50A.

In the method provided by the present disclosure, the spacer part 40 may be formed before the encapsulation layer 50. When forming the encapsulation layer 50, the encapsulation layer 50 may be disconnected on the side surface of the spacer part 40 away from the substrate panel 10. When removing the portion of the display panel in the preset region 300, the cutting process may not damage the encapsulation layer 50, and cracks in the encapsulation layer 50 may be avoided. The encapsulation performance and the reliability of the display panel may be improved.

The spacer part 40 may be formed before the encapsulation layer 50. In one embodiment, the spacer part 40 may be formed after the display function layer 20 and before the encapsulation layer 50. In other embodiments, the spacer part 40 may be formed in the same process for forming a portion of the multi-layered structure in the display function layer 20.

In some embodiments, as illustrated in FIG. 22 and FIGS. 23-35, at least one spacer part 40 in the display panel may be formed by: forming an auxiliary part 60 where at least a portion of the auxiliary part 60 is between the display region AA and the preset region 300; forming at least one spacer part 40 on a side surface of the auxiliary part 60 away from the substrate panel 10; and removing the auxiliary part 60 by a wet etching method or a dry etching method. The bottom of the spacer part 40 close to the substrate panel may be at a side of the auxiliary part 60 away from the preset region 300, and may cover a portion of the surface of the auxiliary part 60.

Structures in the display panel may be formed by an etching process, and the fabrication method of the display panel may use a patterning process including a wet etching process or a dry etching process. When using the wet etching process, different etching solutions may be used for different materials in different layers of the display panel. When using the dry etching process, different etching gases may be used for different materials in different layers of the display panel.

In the present disclosure, the auxiliary part 60 may be used to form the spacer part 40 and then may be removed by the wet etching process or the dry etching process. The spacer part then may have a specific shape where the second inner side edge ZN is at a side of the first inner edge YN close to the preset region 300. When forming the encapsulation layer 50, the encapsulation layer 50 may be disconnected on the side surface of the spacer part 40 away from the substrate panel 10. When removing the portion of the display panel in the preset region 300, the cutting process may not damage the encapsulation layer 50, and cracks in the encapsulation layer 50 may be avoided. The encapsulation performance and the reliability of the display panel may be improved.

In some embodiments, the auxiliary part and the spacer part may be formed in a single process for forming a portion of the multi-layered structure of the display panel. For example, in one embodiment as illustrated in FIGS. 26-30, the display function layer 20 may be formed by: forming an anode material layer; patterning the anode material layer to form anodes of the organic light emitting diodes OL1; forming a pixel definition material layer; patterning the pixel definition material layer to form a pixel definition layer 21 including a plurality of opening areas 211 and to form at least one spacer part 40; forming an organic light emitting material layer OL2 in each opening area 211; and forming a cathode layer OL3 to form the organic light emitting diodes OL in the display function layer 20.

In the present fabrication method for the display panel, the pixel definition layer 21 and the spacer part 40 may be formed by patterning a single pixel material layer in a single process. An additional process and an additional material layer to the spacer part 40 may be reduced. Then a producing efficiency for forming the display panel may be improved and a cost of the display panel may be reduced.

In one embodiment, the auxiliary layer 60 may be further formed in the process for patterning the anode material layer. In the present method, the auxiliary layer 60 may be formed by the process for patterning the anode material layer, then an additional process and an additional material layer for forming the auxiliary part 60 may be reduced. A producing efficiency for forming the display panel may be improved and a cost of the display panel may be reduced.

Figure 31:
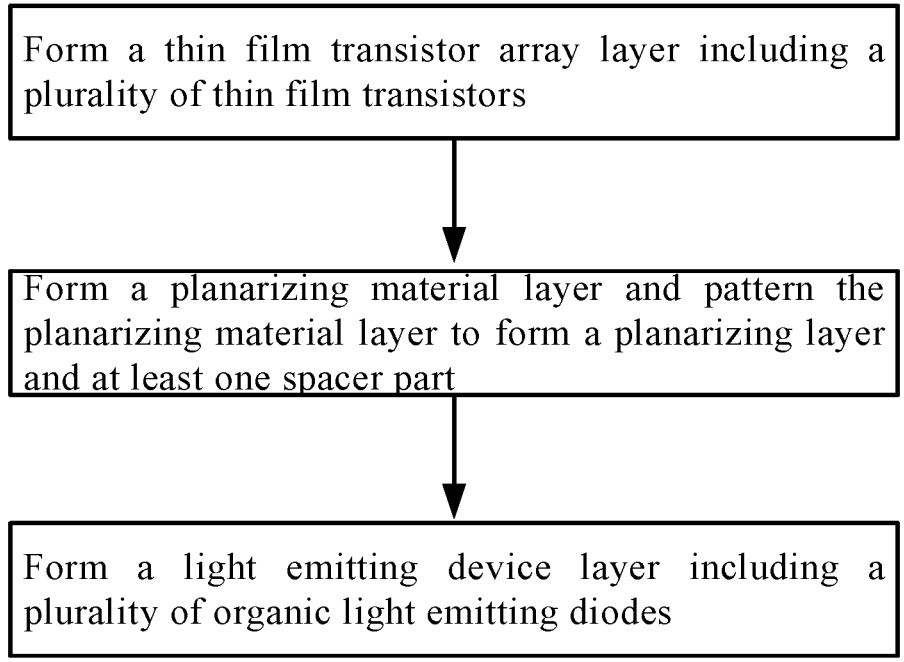
FIG. 31 illustrates another exemplary fabrication method for a display panel consistent with disclosed embodiments in the present disclosure.
Figure 32:
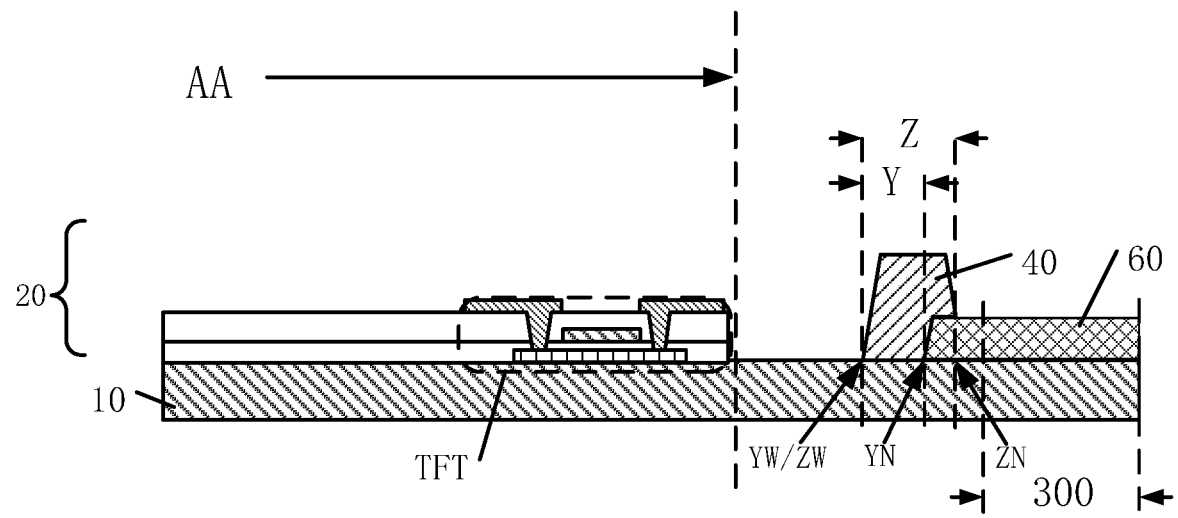
FIGS. 32-34 illustrate cross-sectional structures of the display panel corresponding to various stages in FIG. 31 consistent with disclosed embodiments in the present disclosure.
Figure 33:
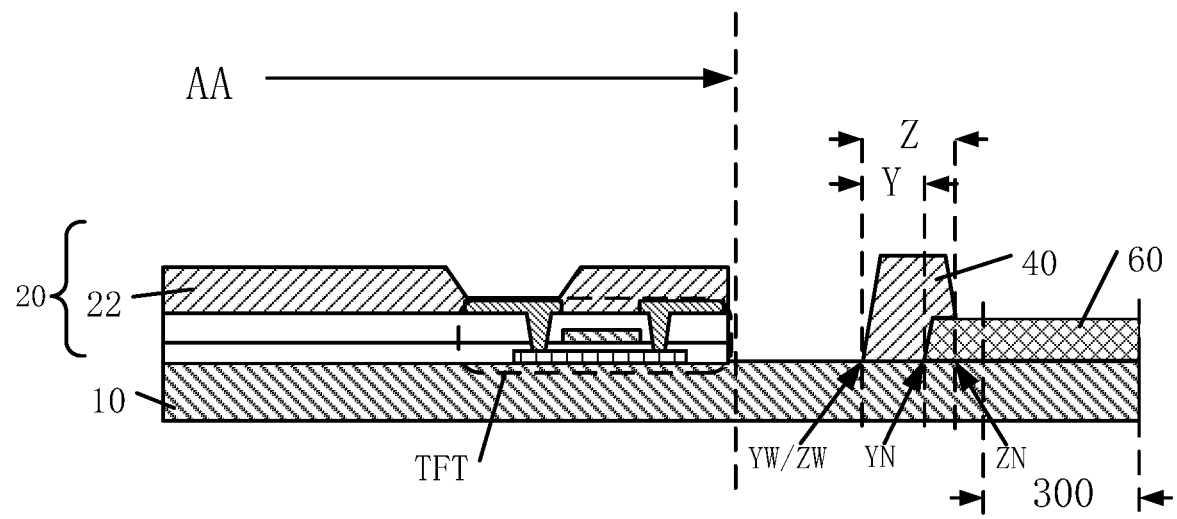
Figure 34:
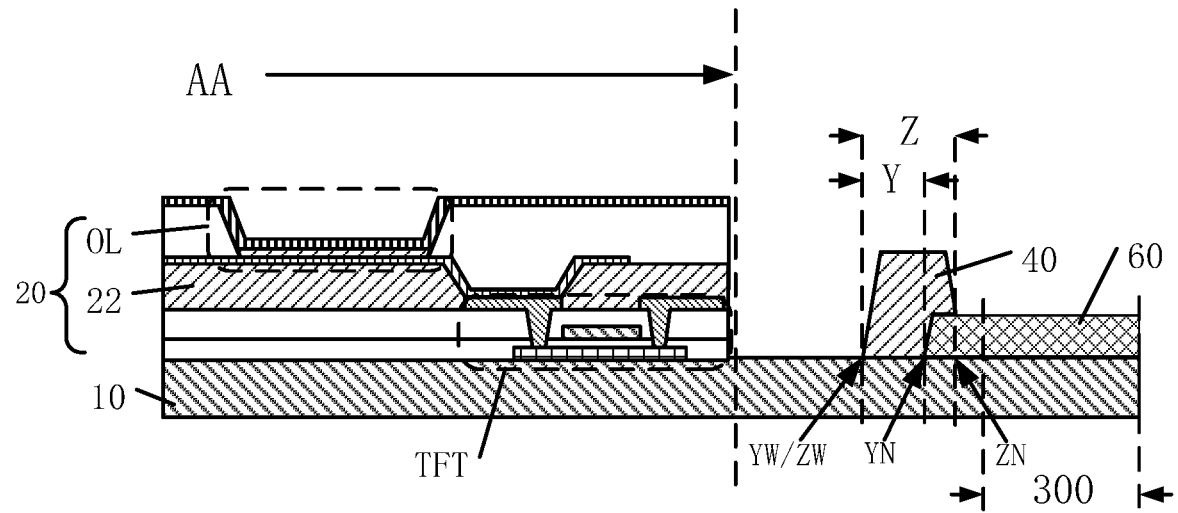
Figure 35:
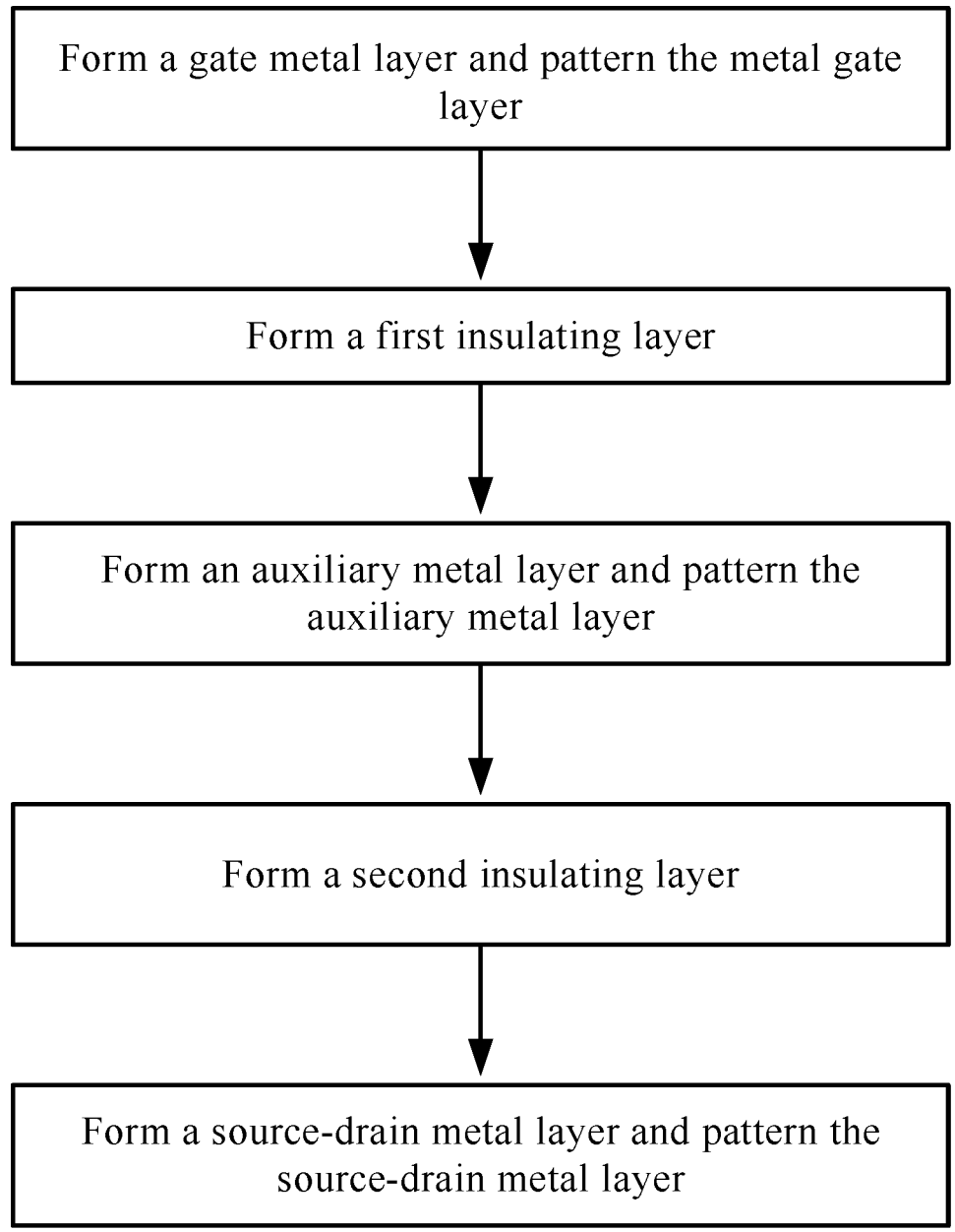
FIG. 35 illustrates another exemplary fabrication method for a display panel consistent with disclosed embodiments in the present disclosure.
Figure 36:
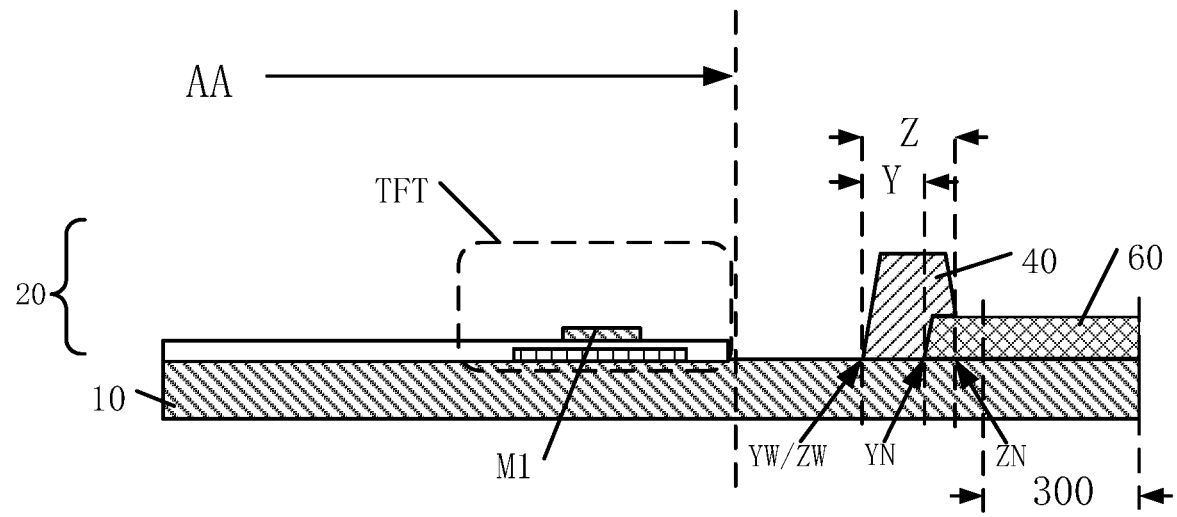
FIGS. 36-40 illustrate cross-sectional structures of the display panel corresponding to various stages in FIG. 35 consistent with disclosed embodiments in the present disclosure.
Figure 37:
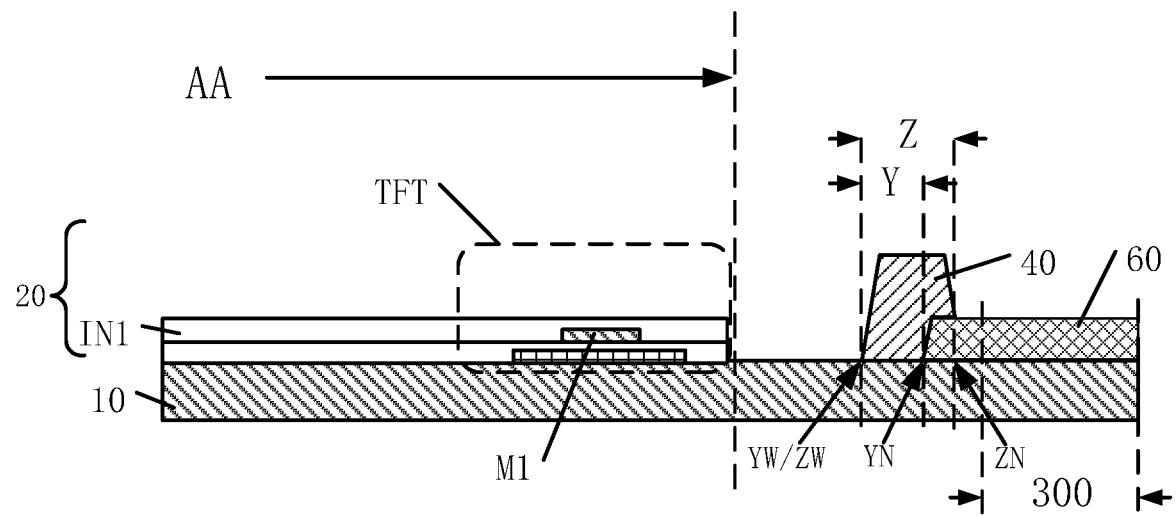
Figure 38:
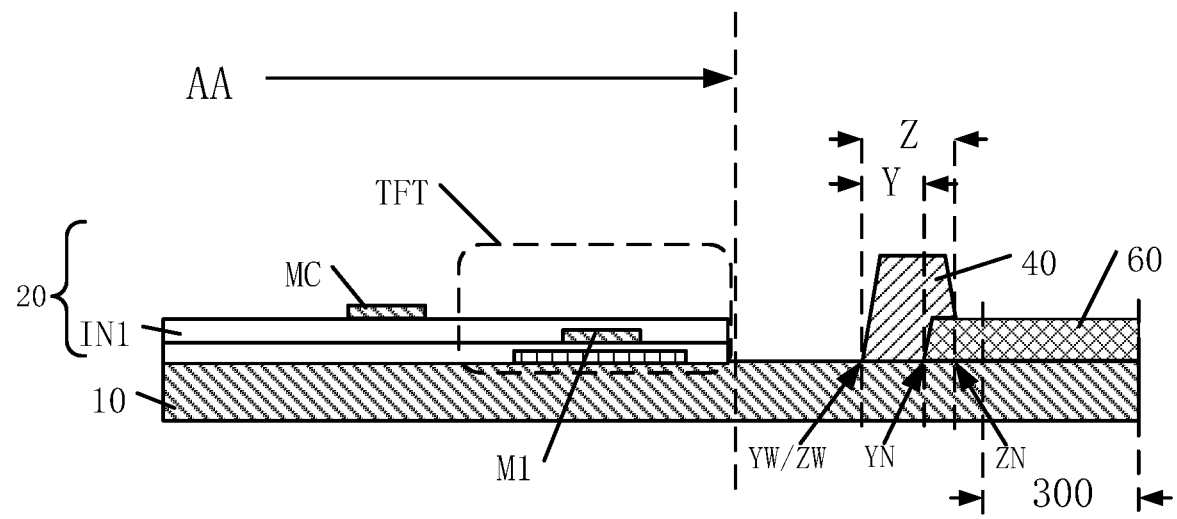
Figure 39:
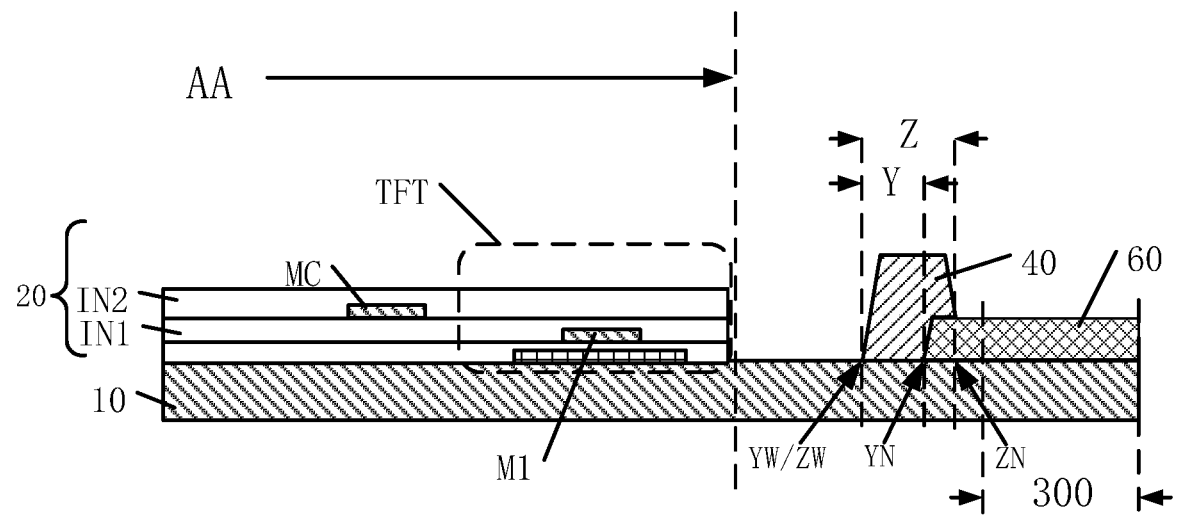
Figures 40, 41:
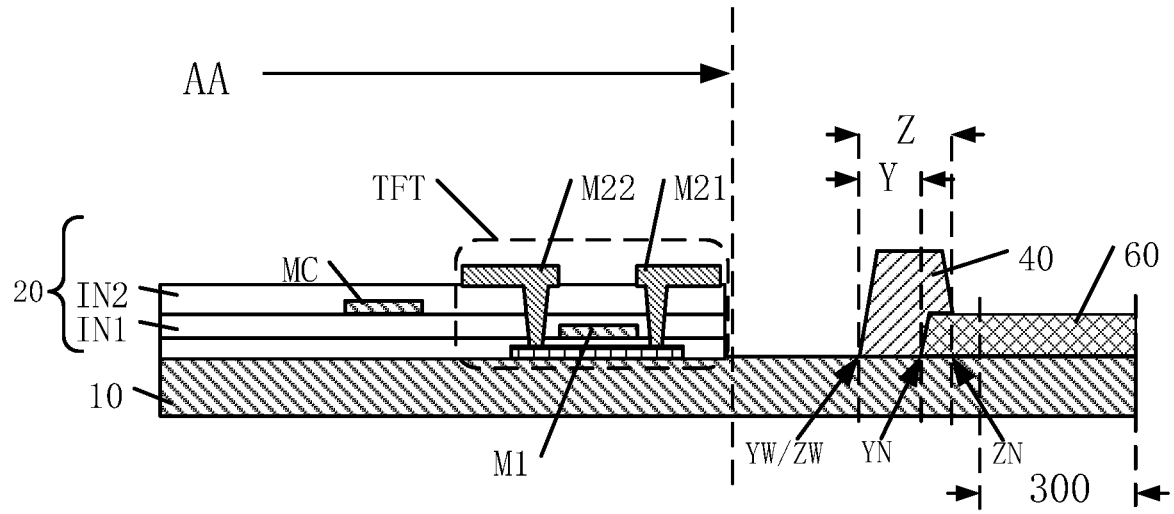
FIG. 41 illustrates another exemplary fabrication method for a display panel consistent with disclosed embodiments in the present disclosure.
Figure 42:
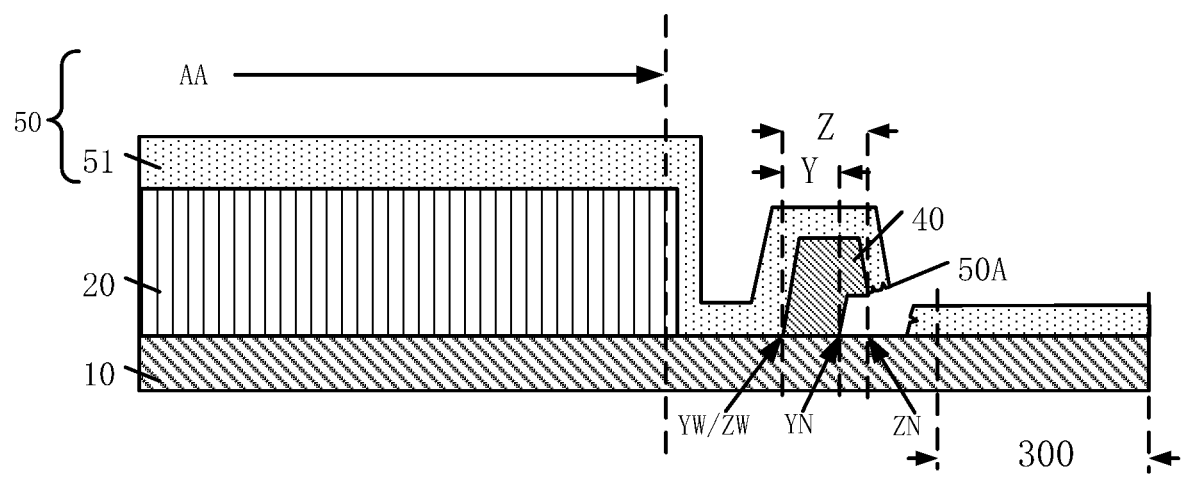
FIGS. 42-44 illustrate cross-sectional structures of the display panel corresponding to various stages in FIG. 41 consistent with disclosed embodiments in the present disclosure.
Figure 43:
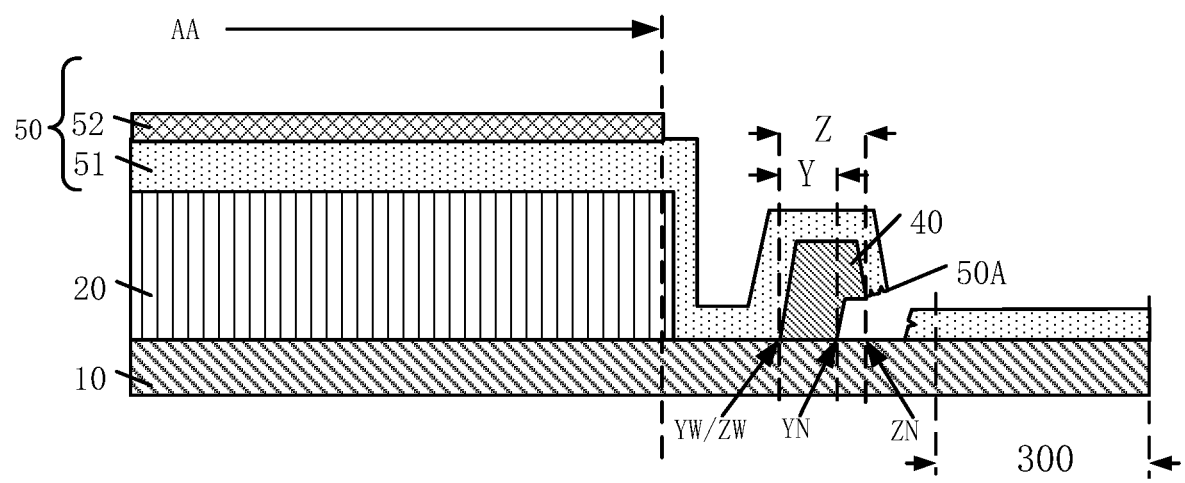
Figure 44:
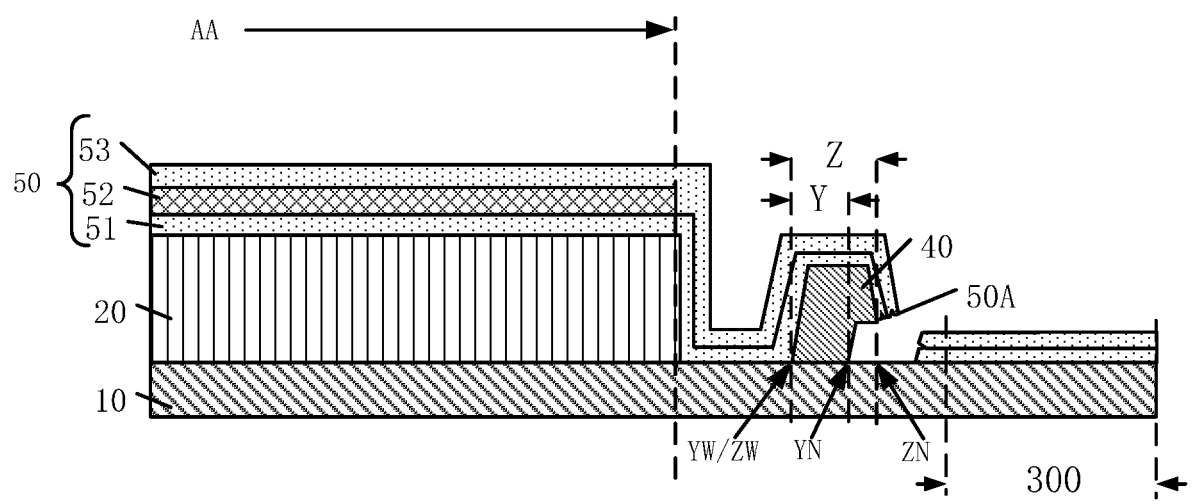

In some other embodiments illustrated in FIGS. 31-32, the display function layer may be formed by: forming a thin film transistor array layer including a plurality of thin film transistors TFT; forming a planarizing material layer; patterning the planarizing material layer to form a planarizing layer 22 and at least one spacer part 40; and forming a light emitting device layer including a plurality of organic light emitting diodes OL.

In the present method, the planarizing layer 22 and the spacer part 40 may be formed by patterning a single material layer in a single process. An additional process and an additional material layer to form the spacer part 40 may be reduced. Then a producing efficiency for forming the display panel may be improved and a cost of the display panel may be reduced.

In one embodiment illustrated in FIGS. 35-40, the thin film transistor array layer may be formed by: forming a gate metal layer; patterning the gate metal layer to form gates M1 for the thin film transistors TFT; forming a first insulating layer IN1; forming an auxiliary metal layer; patterning the auxiliary metal layer to form wires and a capacitance device MC for each TFT; forming a second insulating layer IN2; forming a source-drain metal layer; patterning the source-drain metal layer to form a source M21 and a drain M22 for each TFT. Further, the auxiliary part 60 may be formed in any one process for patterning the gate metal layer, for patterning the auxiliary metal layer and for patterning the source-drain metal layer. In the embodiment illustrated in FIGS. 35-40, the present disclosure is described by using a method where the gates M1 of the thin film transistors TFT and the auxiliary part 60 is formed simultaneously in the process for patterning the gate metal layer.

In the method provided by the present disclosure, the auxiliary part 60 may be formed in any one process for patterning the gate metal layer, for patterning the auxiliary metal layer and for patterning the source-drain metal layer. An additional process and an additional material for forming the auxiliary part 60 may be reduced. A producing efficiency for forming the display panel may be improved and a cost of the display panel may be reduced.

In one embodiment illustrated in FIGS. 41-44, the encapsulation layer 50 may be formed by: forming a first inorganic layer 51 covering the display function layer 20 and extending into a side surface of the spacer part 40 away from the substrate panel 10; forming an organic layer 52 covering the display function layer 20; forming a second inorganic layer 53 covering the display function layer 20 and extending into a side surface of the spacer part 40 away from the substrate panel 10. The first inorganic layer 51 may be disconnected on the side surface of the spacer part 40 away from the substrate panel 10, and the second inorganic layer 51 may be disconnected on the side surface of the spacer part 40 away from the substrate panel 10.

In the method provided by the present disclosure, the encapsulation layer 50 may include the first inorganic layer 51, the organic layer 52 and the second inorganic layer 53. The first inorganic layer 51 and the second inorganic layer 53 may have a dense structure, a large elastic modulus, and a strong brittleness. Correspondingly, the first inorganic layer 51 and the second inorganic layer 53 may be disconnected on the surface of the spacer part 40. When removing the portion of the display panel in the preset region 300, the cutting process may not damage the encapsulation layer 50, and cracks in the encapsulation layer 50 may be avoided. The encapsulation performance and the reliability of the display panel may be improved.

For example only, the present disclosure is described by using a display panel where the inorganic film layer formed after the spacer part is the inorganic layer in the encapsulation layer as an example, and there is no limitation on the scope of the present disclosure. The inorganic film layer in the display panel and the fabrication method provided by the present disclosure may be any inorganic layer in the display panel, including a buffer layer, a gate insulating layer, an interlayer insulating layer, a passive layer, a water-oxygen barrier layer, a dielectric layer and an encapsulation film layer. The inorganic film layer may have a single layer structure or a multi-layer structure.

In the display panel provided by various embodiments of the present disclosure, the spacer part may be formed in the display panel and may have an irregular cross-section. In one embodiment, the second inner side edge of the spacer part pattern may be at a side of the first inner side edge of the bottom pattern close to the hollow portion. Correspondingly, the cross-section of the spacer part may have a narrow bottom and a wide top, that is, a portion of the cross-section of the spacer part 40 close to the substrate panel 10 may be narrower and another portion of the cross-section of the spacer part 40 away from the substrate panel 10 may be wider. And a portion of the top of the cross-section of the spacer part wider than the bottom of the cross-section of the spacer part may be at a side close to the hollow portion.

An inorganic film layer may be formed subsequently in the process for forming the display panel. The inorganic film layer may be formed by an evaporation method or an ink-jet printing method. The inorganic film layer may cover the display function layer and may extend into to a side surface of the spacer part away from the substrate panel. Because the cross-section of the spacer part may have the narrower bottom and the wider top, and a portion of the top of the cross-section of the spacer part wider than the bottom of the cross-section of the spacer part may be at a side close to the hollow portion, the inorganic film layer may be disconnected when forming the inorganic film layer on the display panel. The disconnection of the inorganic film layer may happen on a side surface of the spacer part away from the substrate panel. Because the inorganic film layer may be disconnected on the side surface of the spacer part away from the substrate panel, a cutting process may not damage the inorganic film layer and cracks in the inorganic film layer may be avoided when cutting the display panel to form the hollow portion. A display performance and a reliability of the display panel may be improved.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:
1. A display panel, comprising:
a display region;
a substrate panel;
a display function layer, in the display region and over the substrate panel;

a hollow portion, penetrating through the display panel along a direction perpendicular to a surface of the substrate panel; and a spacer part, configured over the substrate panel and between the display region and the hollow portion, wherein a portion of a bottom of the spacer part that is adjacent to the hollow portion is recessed, from the substrate panel, into the spacer part to form a notched portion, and the spacer part includes:

a bottom pattern, being an orthographic projection, on the substrate panel, of a bottom surface of the spacer part close to the substrate panel, wherein the bottom pattern has a side edge close to the hollow portion as a first inner side edge and a side edge away from the hollow portion as a first outer side edge, and a spacer pattern, being an orthographic projection of the spacer part on the substrate panel, wherein the spacer pattern has a side edge close to the hollow portion as a second inner side edge and a side edge away from the hollow portion as a second outer side edge, wherein the second inner side edge is closer to the hollow portion than the first inner side edge.

2. The display panel according to claim 1, further including an encapsulation layer covering the display function layer, wherein:

the encapsulation layer includes at least one inorganic layer;

the encapsulation layer covers a side surface of the spacer part away from the substrate panel;

an edge of the encapsulation layer close to the hollow portion is a first edge; and the first edge is located at the side surface of the spacer part away from the substrate panel.

3. The display panel according to claim 1, wherein:

the display panel includes two spacer parts, including a first spacer part and a second spacer part; and the second spacer part is located at a side of the first spacer part away from the hollow portion.

4. The display panel according to claim 1, wherein:

the display function layer includes a thin film transistor array layer, a light emitting device layer, and a planarizing layer between the thin film transistor array layer and the light emitting device layer;

the thin film transistor array layer includes a plurality of thin film transistors;

the light emitting device layer includes a plurality of organic light emitting diodes; and the spacer part has a single layer structure and is made of a material same as the planarizing layer, or the spacer part includes a plurality of sub-film layers stacked together and one of the sub-film layers is made of a material same as the planarizing layer.

5. The display panel according to claim 1, wherein:

the display function layer includes a light emitting device layer;

the light emitting device layer includes a plurality of organic light emitting diodes;

the light emitting device layer includes a pixel definition layer with a plurality of opening areas;

at least a portion of the organic light emitting diodes is located in the opening areas; and the spacer part has a single layer structure and is made of a material same as the pixel definition layer, or the spacer part includes a plurality of sub-film layers stacked together and one of the sub-film layers is made of a material same as the pixel definition layer.

6. The display panel according to claim 1, wherein:

a distance between the first inner side edge and the second inner side edge is about 1 µm to about 3 µm.

7. The display panel according to claim 1, wherein:

a cross-section of the spacer part is a cross-sectional pattern;

the cross-sectional pattern includes a top edge and a bottom edge opposing each other;

the cross-sectional pattern further includes a first side edge and a second side edge opposing each other;

the bottom edge is at a side of the cross-sectional pattern close to the substrate panel;

the top edge is at a side of the cross-sectional pattern away from the substrate panel;

the second side edge is at a side of the first side edge close to the hollow portion;

a first end of the first side edge is connected to a first end of the top edge;

a second end of the first side edge is connected to a first end of the bottom edge;

the second side edge includes a first segment and a second segment;

the first segment is recessed toward an inside of the cross-sectional pattern to form the notched portion;

a second end of the first segment is connected to a second end of the second segment to form a sharp corner protruding toward an outside of the cross-sectional pattern.

8. The display panel according to claim 7, wherein a portion of the encapsulation layer on the side surface of the spacer part away from the substrate panel has a thickness smaller than a distance between an apex of the sharp corner and the substrate panel.

9. The display panel according to claim 1, wherein:

the encapsulation layer includes two inorganic layers and an organic layer between the two inorganic layers.

10. The display panel according to claim 1, wherein:

the display panel has an irregular edge; and the irregular edge is recessed toward an inside of the display panel to form the hollow portion.

11. The display panel according to claim 1, wherein the display region surrounds the hollow portion and the spacer part surrounds the hollow portion.

12. A display device, comprising:

an electronic device, comprising one or more of a camera, an earpiece, and a light sensor, and a display panel, comprising:

a display region;

a substrate panel;

a display function layer, in the display region and over the substrate panel;

a hollow portion, penetrating through the display panel along a direction perpendicular to a surface of the substrate panel, wherein the electronic device in placed in the hollow portion; and a spacer part, configured over the substrate panel and between the display region and the hollow portion, wherein a portion of a bottom of the spacer part that is adjacent to the hollow portion is recessed, from the substrate panel, into the spacer part to form a notched portion, and the spacer part includes:

a bottom pattern, being an orthographic projection, on the substrate panel, of a bottom surface of the spacer part close to the substrate panel, wherein the bottom pattern has a side edge close to the hollow portion as a first inner side edge and a side edge away from the hollow portion as a first outer side edge, and a spacer pattern, being an orthographic projection of the spacer part on the substrate panel, wherein the spacer pattern has a side edge close to the hollow portion as a second inner side edge and a side edge away from the hollow portion as a second outer side edge, wherein the second inner side edge is closer to the hollow portion than the first inner side edge.

13. A fabrication method for a display panel, comprising:

providing a substrate panel, the substrate panel having a display region and a preset region;

forming a display function layer on the substrate panel, wherein the display function layer is in the display region;

forming an encapsulation layer on the display function layer to cover the display function layer, wherein a portion of the encapsulation layer extends into the preset region; and removing a portion of the display panel in the preset region to form a hollow portion;

wherein:

before forming the encapsulation layer, at least one spacer part is formed between the display region and the preset region;

a bottom pattern is an orthographic projection, on the substrate panel, of a bottom surface of the spacer part close to the substrate panel;

the bottom pattern has a side edge close to the hollow portion as a first inner side edge and a side edge away from the hollow portion as a first outer side edge;

a spacer pattern is an orthographic projection of the spacer part on the substrate panel;

the spacer pattern has a side edge close to the hollow portion as a second inner side edge and a side edge away from the hollow portion as a second outer side edge;

the second inner side edge is closer to the hollow portion than the first inner side edge;

the encapsulation layer includes at least one inorganic layer;

a portion of the encapsulation layer extends to the spacer part and covers a side surface of the spacer part away from the substrate panel; and the encapsulation layer is disconnected on the side surface of the spacer part away from the substrate panel to form a first edge.

14. The method according to claim 13, wherein forming the at least one spacer part includes:

forming an auxiliary part, wherein at least a portion of the auxiliary part is located between the display region and the preset region;

forming the spacer part on a surface of the auxiliary part away from the substrate panel; and removing the auxiliary part by a wet etching method or a dry etching method;

wherein:

a bottom of the spacer part close to the substrate panel is located at a side of the auxiliary part away from the preset region; and the spacer part covers a portion of a surface of the auxiliary part.

15. The method according to claim 14, wherein forming the display function layer includes:

forming a thin film transistor array layer, including a plurality of thin film transistors;

forming a planarizing material layer;

patterning the planarizing material layer to form a planarizing layer and the at least one spacer part; and forming a light emitting device layer including a plurality of organic light emitting diodes.

16. The method according to claim 15, wherein forming the thin film transistor array layer includes:

forming and patterning a gate metal layer;

forming a first insulating layer;

forming and patterning an auxiliary metal layer;

forming a second insulating layer; and forming and patterning a source-drain metal layer; and wherein:

the auxiliary part is formed in any one process for patterning the gate metal layer, patterning the auxiliary metal layer, and patterning the source-drain metal layer.

17. The method according to claim 14, wherein forming the display function layer includes:

forming and patterning anode material layer;

forming a pixel definition material layer;

patterning the pixel definition material layer to form a pixel definition layer with a plurality of opening areas and to form at least one spacer part;

forming an organic light emitting material layer in each opening area; and forming a cathode layer.

18. The method according to claim 17, wherein:

the auxiliary part is formed in the process for patterning the anode material layer.

19. The method according to claim 14, wherein forming the encapsulation layer includes:

forming a first inorganic layer covering the display function layer and extending onto the side surface of the spacer part away from the substrate panel;

forming an organic layer covering the display function layer; and forming a second inorganic layer covering the display function layer and extending to the side surface of the spacer part away from the substrate panel; wherein the first inorganic layer is disconnected on the side surface of the spacer part away from the substrate panel; and the second inorganic layer is disconnected on the side surface of the spacer part away from the substrate panel.

20. The method according to claim 13, wherein:

the display function layer includes a multi-layered structure, and the at least one spacer part is formed in a same process for forming a portion of the multi-layered structure of the display function layer.

* * * * *